(12) United States Patent
Chang et al.

(10) Patent No.: US 11,791,005 B2
(45) Date of Patent: Oct. 17, 2023

(54) MEMORY CIRCUIT AND METHOD OF OPERATING SAME

(71) Applicant: TAIWAN SEMICONDUCTOR MANUFACTURING COMPANY, LTD., Hsinchu (TW)

(72) Inventors: Meng-Sheng Chang, Hsinchu (TW); Chia-En Huang, Hsinchu (TW); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 19 days.

(21) Appl. No.: 17/154,576

(22) Filed: Jan. 21, 2021

(65) Prior Publication Data

US 2021/0383883 A1     Dec. 9, 2021

Related U.S. Application Data

(60) Provisional application No. 63/034,133, filed on Jun. 3, 2020.

(51) Int. Cl.
| | | |
|---|---|---|
| *G11C 7/18* | (2006.01) | |
| *G11C 17/16* | (2006.01) | |
| *G11C 17/06* | (2006.01) | |
| *G11C 16/08* | (2006.01) | |
| *G11C 16/10* | (2006.01) | |

(Continued)

(52) U.S. Cl.
CPC ............. *G11C 17/16* (2013.01); *G11C 16/08* (2013.01); *G11C 16/10* (2013.01); *G11C 16/26* (2013.01); *G11C 17/06* (2013.01); *G11C 17/123* (2013.01)

(58) Field of Classification Search
CPC ... H01L 27/11206; G11C 17/14; G11C 17/16; G11C 17/06
See application file for complete search history.

(56) References Cited

U.S. PATENT DOCUMENTS 5,579,142 A * 11/1996 Sawayama .......... G02F 1/13725
                                                          349/177
5,703,824 A    12/1997 Isa
(Continued)

FOREIGN PATENT DOCUMENTS

CN      106653081       5/2017
KR    10-2008-0043173   5/2008
(Continued)

OTHER PUBLICATIONS

Office Action dated Jan. 22, 2022 for corresponding case No. TW 11120080780. (pp. 1-3).

(Continued)

*Primary Examiner* — Uyen Smet
(74) *Attorney, Agent, or Firm* — Hauptman Ham, LLP

(57) ABSTRACT

A memory circuit includes a first programming device, a first circuit branch and a second circuit branch. The first programming device includes a first control terminal coupled to a first word line, and a first connecting end. The first circuit branch includes a first diode, and a first fuse element coupled to the first diode. The second circuit branch includes a second diode, and a second fuse element coupled to the second diode. The first circuit branch and the second circuit branch are coupled to the first connecting end of the first programming device.

20 Claims, 12 Drawing Sheets

(51) Int. Cl.
*G11C 16/26* (2006.01)
*G11C 17/12* (2006.01)

(56) References Cited

U.S. PATENT DOCUMENTS

| | | |
|---|---|---|
| 7,260,442 B2 | 8/2007 | Hwang et al. |
| 8,054,667 B2 | 11/2011 | Min et al. |
| 9,256,709 B2 | 2/2016 | Yu et al. |
| 10,325,906 B2 | 6/2019 | Chang et al. |
| 2003/0193053 A1 | 10/2003 | Gilton |
| 2008/0251884 A1* | 10/2008 | Chung ................... G11C 17/18 |
| | | 257/529 |
| 2014/0040838 A1 | 2/2014 | Liu et al. |
| 2015/0278429 A1 | 10/2015 | Chang |
| 2017/0125120 A1 | 5/2017 | Yang |
| 2017/0250187 A1 | 8/2017 | Taniguchi et al. |
| 2017/0345827 A1* | 11/2017 | Chang ............. H01L 21/823475 |

FOREIGN PATENT DOCUMENTS

| | | |
|---|---|---|
| KR | 10-2009-0036384 | 4/2009 |
| KR | 20100082046 | 7/2010 |
| KR | 20170078749 | 7/2017 |
| TW | 200901627 | 1/2009 |
| TW | 201805950 | 2/2018 |

OTHER PUBLICATIONS

Office Action dated Jun. 17, 2022 for corresponding case No. KR 10-2021-0036702. (pp. 1-6).

* cited by examiner

MEMORY CIRCUIT AND METHOD OF OPERATING SAME

PRIORITY CLAIM

The instant application is a non-provisional application claiming priority to U.S. Provisional Application No. 63/034,133, filed Jun. 3, 2020, the entire contents of which are incorporated by reference herein.

BACKGROUND

The semiconductor integrated circuit (IC) industry has produced a wide variety of devices to address issues in a number of different areas. Some of these devices, such as memory cells, are configured for the storage of data. As memory cells become smaller and more complex, the resistance of conductive lines within these devices are also changed affecting the characteristics of these devices and overall memory cell performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
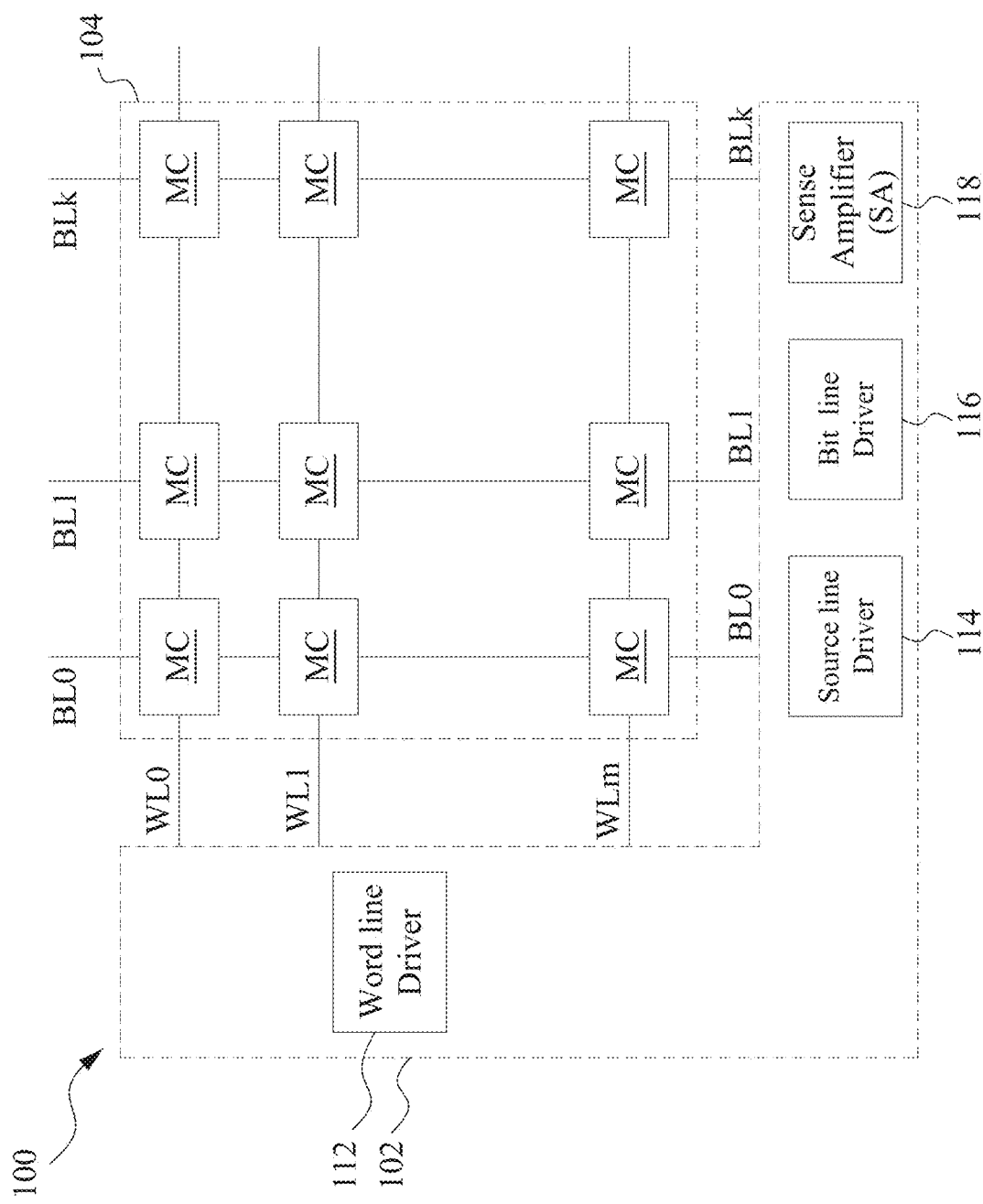
FIG. 1 is a schematic block diagram of a memory device, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A non-volatile memory is a type of memory that is programmed to record data therein. Non-volatile memory is able to retain data after supply power is interrupted. There are various types of non-volatile memory, including, for example, a multi-time programming memory (also referred to as MTP memory), a one-time programmable (OTP) memory, a fuse element, or the like. Some types of OTP memory, such as an electrical fuse (eFuse) use a narrow stripe (also called a "link") of conductive material (metal, polysilicon, or the like) connected to other circuit elements at each end. To program an eFuse, a programming current is applied to destructively alter (i.e., fuse) the link, thus increasing the resistance of the eFuse. In some embodiments, to determine the status of an eFuse, a sense circuit is coupled to the link and the sense amplifier makes a comparison with a reference resistive device.

In one or more embodiments, a memory circuit is disclosed. In some embodiments, the memory circuit includes fuse elements configured as non-volatile memory. The fuse elements are configured in a high resistance state or a low resistance state, where the high resistance state corresponds to a first bit value while the low resistance state corresponds to a second bit value. In this manner, the fuse elements are configured to store data in a non-volatile manner.

In some embodiments, the memory circuit further includes programming devices. In some embodiments, multiple fuse elements are connected to each programming device. Thus, the multiple fuse elements share a same programming device, which significantly reduces the area occupied by the memory circuit compared to other approaches.

In some embodiments, the memory circuit further includes diodes. In some embodiments, each diode corresponds to a via between two metal layers. In some embodiments, each diode is coupled to a corresponding fuse element in a corresponding circuit branch. In some embodiments, the diodes are configured to block current from reaching unselected fuse elements thereby preventing the unselected fuse elements from being inadvertently accessed thereby improving performance compared to other approaches.

FIG. 1 is a schematic block diagram of a memory device 100, in accordance with some embodiments. In at least one embodiment, a memory device is an individual IC device. In some embodiments, a memory device is included as a part of a larger IC device which comprises circuitry other than the memory device for other functionalities.

The memory device 100 comprises at least one memory cell MC and a controller (also referred to as "control circuit") 102 coupled to control an operation of the memory cell MC. In the example configuration in FIG. 1, the memory device 100 comprises a plurality of memory cells MC arranged in a plurality of columns and rows in a memory cell array 104. The memory device 100 further includes a plurality of word lines WL0, WL1 to WLm extending along the rows of the memory cell array 104, where m is an integer, and memory cell array 104 includes m−1 rows of memory cells MC and word lines WL. The memory device 100 further includes a plurality of bit lines BL0, BL1 to BLk extending along the columns of the memory cell array 104, where k is an integer, and memory cell array 104 includes k−1 columns of memory cells MC and bit lines BL. The word lines are commonly referred to herein as WL and the bit lines are commonly referred to herein as BL. Each of the memory cells MC is coupled to the controller 102 by a corresponding word line WL and a corresponding bit line BL. The word lines WL are configured for transmitting word line signals to memory cells MC that are to be read from, and/or to be written to, or the like. The bit lines BL are configured for transmitting bit line signals (e.g., data to be written to, and/or read from, the memory cells MC). The bit lines BL are sometimes referred to as "data lines." Various numbers of memory cells MC, word lines WL and/or bit lines BL in the memory device 100 are within the scope of various embodiments.

In the example configuration in FIG. 1, the controller 102 comprises a word line driver 112, a source line driver 114, a bit line driver 116, and a sense amplifier (SA) 118 which are configured to perform at least one of a read operation or a write operation. In at least one embodiment, the controller 102 further includes one or more clock generators for providing clock signals for various components of the memory device 100, one or more input/output (I/O) circuits for data exchange with external devices, and/or one or more controllers for controlling various operations in the memory device 100.

The word line driver 112 is coupled to the memory cell array 104 via the word lines WL. The word line driver 112 is configured to decode a row address of the memory cell MC selected to be accessed in a read operation or a write operation. The word line driver 112 is configured to supply a set of voltages to the selected word lines WL corresponding to the decoded row address, and a different set of voltages to the other, unselected word lines WL. The source line driver 114 is coupled to the memory cell array 104 via source lines SL (not shown for simplicity). The bit line driver 116 is coupled to the memory cell array 104 via the bit lines BL. The source line driver 114 and/or the bit line driver 116 is/are configured to decode a column address of the memory cell MC selected to be accessed in a read operation or a write operation. The source line driver 114 and/or the bit line driver 116 is/are configured to supply a set of voltages (e.g., source line signal and bit line signal) to the selected source line SL and the selected bit line BL corresponding to the selected memory cell MC, and a different set of voltages to the other, unselected source lines SL and unselected bit lines BL. For example, in a write operation (also referred to as "programming operation"), the source line driver 114 is configured to supply a write voltage (also referred to as "program voltage") to the selected source line SL. In a read operation, the source line driver 114 is configured to supply a read voltage to the selected bit line BL. The SA 118 is coupled to the memory cell array 104 by the bit lines BL. In a read operation, the SA 118 is configured to sense data read from the accessed memory cell MC and retrieved through the corresponding selected bit line BL. The described memory device configuration is an example, and other memory device configurations are within the scopes of various embodiments. In at least one embodiment, the memory device 100 is a one-time programmable (OTP) non-volatile memory, and the memory cells MC are OTP memory cells. Other types of memory are within the scopes of various embodiments.

Figure 2:
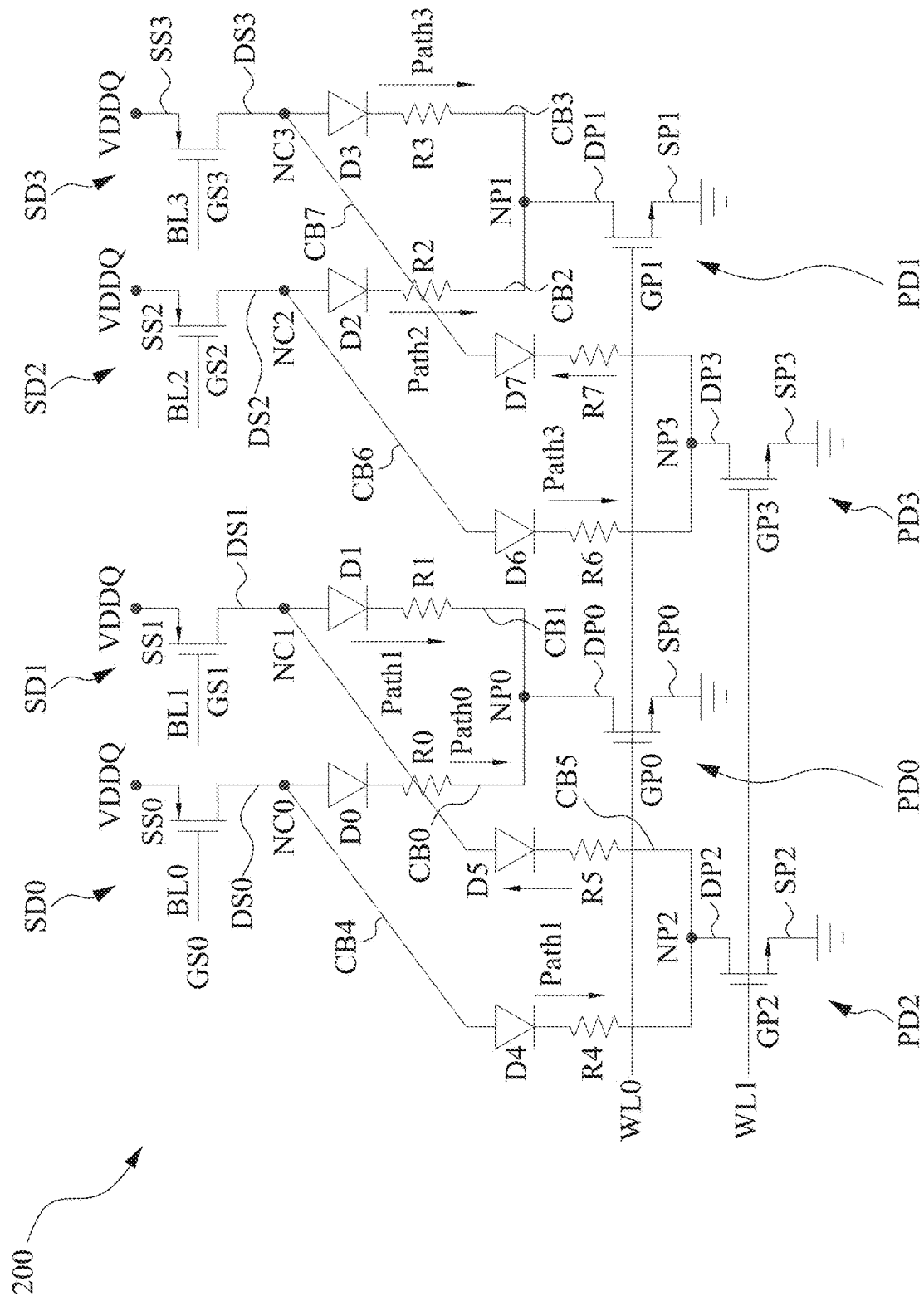
FIG. 2 illustrates a circuit diagram of a memory device, in accordance with some embodiments.

FIG. 2 illustrates a circuit diagram of a memory device 200, in accordance with some embodiments. In some embodiments, memory device 200 corresponds to a portion of the memory device 100. For example, in some embodiments, memory device 200 corresponds to 2 word lines (e.g., WL0, WL1), 4 bit lines (BL0, BL1, BL2 and BL3) and corresponding memory cells MC of memory cell array 104.

The memory device 200 includes a plurality of fuse elements R0-R7, which are represented with resistance symbols. The fuse elements R0-R7 are provided in a fuse element layer. In some embodiments, the fuse element layer is metal layer M2, discussed below with respect to FIG. 2.

The memory device 200 also includes a plurality of diodes D0-D7 that are connected to the fuse elements R0-R7. In some embodiments, each of the plurality of diodes D0-D7 are vias located between a metal-two (M2) layer and a metal-three (M3) layer of memory device 200. Other metal layers for the plurality of diodes D0-D7 in memory circuit 200 are within the scope of the present disclosure. The diode D0 is connected in series to the fuse element R0. The diode D1 is connected in series to the fuse element R1. The diode D2 is connected in series to the fuse element R2. The diode D3 is connected in series to the fuse element R3. The diode D4 is connected in series to the fuse element R4. The diode D5 is connected in series to the fuse element R5. The diode D6 is connected in series to the fuse element R6. The diode D7 is connected in series to the fuse element R7. Accordingly, the plurality of diodes D0-D7 and the corresponding plurality of fuse elements R0-R7 form a corresponding plurality of circuit branches CB0-CB7. In this embodiment, each of the circuit branches CB0-CB7 each provide one of the memory cells MC, discussed above with respect to FIG. 1. In some embodiment, the diodes D0-D7 are provided in the interconnection layer VIA2, discussed below with respect to FIG. 3. In some embodiments, each of the diodes D0-D7 correspond to a via between metal layer M3 and metal layer M2. In some embodiments, memory device 200 includes any number of memory cells, including less than 8 or more than 8.

The memory device 200 further includes a plurality of programming devices PD0-PD3. Each programming device PD0-PD3 of the plurality of programming devices has a control terminal (referred to generically as elements GP and specifically as corresponding elements GP0-GP3), a first end (referred to generically as elements DP and specifically as corresponding elements DP0-DP3), and a second end (referred to generically as elements SP and specifically as corresponding elements SP0-SP3). In this example, each of the programming devices PD0-PD3 is an NMOS device. Accordingly, the control terminal GP of each of the programming devices PD0-PD3 is the gate GP of the NMOS device. Furthermore, the first end DP of each of the programming devices PD0-PD3 is the drain DP of the NMOS device, and the second end SP of each of the programming devices PD0-PD3 is the source SP of the NMOS device. In this embodiment, the source SP of each of the programming devices PD0-PD3 is connected to a reference voltage supply to receive a reference voltage, e.g., a ground voltage VSS. Furthermore, the drain DP of each of the programming devices PD0-PD3 is connected to a corresponding node NP0, NP1, NP2 and NP3. Each node NP0-NP3 is coupled to a pair of circuit branches of circuit branches CB0-CB7. Thus, the drain DP of each of the programming devices PD0-PD3 is connected to more than one of the fuse elements R0-R7 and more than one of the diodes D0-D7.

In this specific embodiment, the drain DP of each of the programming devices PD0-PD3 is connected to a different pair of circuit branches CB0-CB7. More specifically, the drain DP0 of the programming device PD0 is connected to one end of the circuit branch CB0 at node NP0 and is connected to one end of the circuit branch CB1 at node NP0. A gate GP0 of the programming device PD0 is connected to the word line WL0. The drain DP1 of the programming device PD1 is connected to one end of the circuit branch CB2 at node NP1 and is connected to one end of the circuit branch CB3 at node NP1. A gate GP1 of the programming device PD1 is connected to the word line WL0. The gates GP0, GP1 of the programming devices PD0, PD1 are both connected to the same word line WL0. Thus, the circuit branches CB0, CB1, which both include corresponding memory cells, share the same programming device PD0, and the circuit branches CB2, CB3, which both include corresponding memory cells, also share the same programming device PD1.

At node NP2, the drain DP2 of the programming device PD2 is connected to one end of the circuit branch CB4, and the drain DP2 of the programming device PD2 is further connected to one end of the circuit branch CB5. A gate GP2 of the programming device PD2 is connected to the word line WL1. At node NP3, the drain DP3 of the programming device PD3 is connected to one end of the circuit branch CB6, and the drain DP3 of the programming device PD3 is further connected to one end of the circuit branch CB7. A gate GP3 of the programming device PD3 is connected to the word line WL1. The gates GP2, GP3 of the programming devices PD2, PD3 are both connected to the same word line WL1. Thus, the circuit branches CB4, CB5, which both include corresponding memory cells, share the same programming device PD2, and the circuit branches CB6, CB7, which both include corresponding memory cells, also share the same programming device PD3.

Other configurations or transistor types for programming devices PD0-PD3 are within the scope of the present disclosure. For example, in other embodiments, one or more of the programming devices PD0-PD3 are PMOS devices instead of NMOS devices. In other embodiments, three (3) or more circuit branches are connected to the drain of each of the programming devices PD0-PD3. In other embodiments, there are less than four (4) programming devices of programming devices PD0-PD3, or more than four (4) programming devices of programming devices PD0-PD3 depending on the ratio of word lines to circuit branches for a particular design. In some embodiments, the overall area of memory circuit 200 is significantly reduced by having multiple memory cells share the same programming devices PD0-PD3. In some embodiments, the reduction in the overall area of memory circuit 200 is at least 40%.

Programming devices PD0-PD3 are configured to program fuse elements R0-R7. In some embodiments, prior to being programmed, each of the fuse elements R0-R7 have a conductive link and are in a low resistance state. The programming devices PD0-PD3 are each configured to generate sufficient programming current so as to destructively alter the conductive link within their respective fuse element R0-R7 so that the fuse elements R0-R7 are configured in a high resistance state. The high resistance state or the low resistance state of the fuse elements R0-R7 are used to represent bit values, and thus data can be stored in a non-volatile manner in the memory device 200. In some embodiments, read devices (not shown) are also included in the memory circuit 200. The read devices also generate a read current that does not alter the conductive link, and the corresponding resistance state (either the high resistance state or the low resistance state) of the corresponding fuse elements R0-R7 can be determined by a sense amplifier (not shown).

The memory device 200 further includes a plurality of selection devices SD0-SD3. Each selection device SD0-SD3 of the plurality of selection devices has a control terminal (referred to generically as element GS and specifically as corresponding elements GS0-GS3), a first end (referred to generically as elements DS and specifically as corresponding elements DS0-DS3), and a second end (referred to generically as elements SS and specifically as corresponding elements SS0-SS3). In this example, each of the selection devices SD0-SD3 is a PMOS device. Accordingly, the control terminal GS of each of the selection devices SD0-SD3 is the gate GS of the PMOS device. Furthermore, the first end DS of each of the selection devices SD0-SD3 is the drain DS of the PMOS device, and the second end SS of each of the selection devices SD0-SD3 is the source SS of the PMOS device. In this embodiment, the source SS of each of the selection devices SD0-SD3 is configured to receive a supply voltage, e.g., VDDQ. Furthermore, at nodes NC0-NC3, the drain DS of each of the selection devices SD0-SD3 is connected to more than one of the circuit branches CB0-CB7, and is thus connected to more than one of the fuse elements R0-R7 and more than one of the diodes D0-D7.

In this specific embodiment, the drain DS of each of the selection devices SD0-SD3 is connected to a different pair of the circuit branches CB0-CB7. More specifically, the drain DS0 of the selection device SD0 is connected to another end of the circuit branch CB0 at node NC0, and is connected to another end of the circuit branch CB4 at node NC0. The selection device SD0 provides a selectable connection to the bit line BL0 in response to a bit line selection signal received at the gate GS0 of the selection device SD0. In this example, the selection device SD0 is a PMOS transistor, and thus, the bit line selection signal is provided in a low logical value to turn on the selection device SD0 and, thereby select the bit line BL0. An anode of the diode D0 is connected to the drain DS0 of the selection device SD0 by node NC0, and a cathode of the diode D0 is connected to the drain DP0 of the programming device PD0 by fuse element R0. In other words, the fuse element R0 is connected between the cathode of the diode D0 and the drain DP0 of the programming device PD0. Furthermore, the anode of the diode D4 is connected to the drain DS0 of the selection device SD0 by node NC0, and the cathode of the diode D4 is connected to the drain DP2 of the programming device PD2 by fuse element R4. In other words, the fuse element R4 is connected between the cathode of the diode D4 and the drain DP2 of the programming device PD2. Accordingly, the selection device SD0 is connected to circuit branches CB0, CB4 at node NC0. Furthermore, the circuit branches CB0, CB4 are connected to programming devices PD0, PD2 at nodes NP0, NP2, respectively, where the programming devices PD0, PD2 are controlled by different word lines WL0, WL1.

The drain DS1 of the selection device SD1 is connected to another end of the circuit branch CB1 at node NC1, and is connected to another end of the circuit branch CB5 at node NC1. The selection device SD1 provides a selectable connection to the bit line BL1 in response to a bit line selection signal received at the gate GS1 of the selection device SD1. In this example, the selection device SD1 is a PMOS transistor and thus, the bit line selection signal is provided in a low logical value to turn on the selection device SD1, and thereby select the bit line BL1. An anode of the diode D1 is connected to the drain of the selection device SD1 by node NC1, and a cathode of the diode D1 is connected to the drain DP0 of the programming device PD0 by fuse element R1. In other words, the fuse element R1 is connected between the cathode of the diode D1 and the drain DP0 of the programming device PD0. Furthermore, the anode of the diode D5 is connected to the drain DS1 of the selection device SD1 by node NC1, and the cathode of the diode D5 is connected to the drain DP2 of the programming device PD2 by fuse element R5. In other words, the fuse element R5 is connected between the cathode of the diode D5 and the drain DP2 of the programming device PD2. Accordingly, the selection device SD1 is connected to circuit branches CB1, CB5 at node NC1. Furthermore, the circuit branches CB1, CB5 are connected to programming devices PD0, PD2 at nodes NP0, NP2, respectively, where the programming devices PD0, PD2 are controlled by different word lines WL0, WL1.

In some embodiments, the connection of the circuit branches CB0, CB1, CB4 and CB5 to the same pair of selection devices SD0, SD1 and programming devices PD0, PD2 controlled by different word lines WL0, WL1 can create multiple current paths to the programming device PD0, PD1. In some embodiments, the addition of diodes D0, D1 and diodes D4, D5 to memory circuit 200 disrupts at least one of the current paths. In particular, if one of the circuit branches CB0, CB1, CB4, CB5 connected to one of the programming devices PD0, PD2 is selected for programming, the pair of circuit branches CB4, CB5, CB0, CB1 connected to the other one of the programming devices PD2, PD0 would create an alternative current path to the other circuit branch CB1, CB0, CB5, CB4 connected to the same one of the programming devices PD0, PD2. The diodes D4, D5, D0, D1 are configured to stop current from flowing to this alternate current path.

An example will help illustrate. For instance, if fuse element R0 has been selected to be programmed, then a low logical value is applied to the gate GS0 of the selection device SD0 to select the bit line BL0 to turn on the selection device SD0, and a high logical value is applied to the word line WL0 to turn on the programming device PD0. Accordingly, a current (Path0 in FIG. 2) will be generated in the circuit branch CB0. However, if the diodes D0, D1, D4, D5 were not included in memory circuit 200, the circuit branches CB4, CB5 connected to the drain of the programming device PD2 would provide an alternate current path (Path1) to the drain DP0 of the programming device PD0, and further through the circuit branch CB1 to node NP0. In other words, without diodes D0, D1, D4, D5, the current would be provided through the intended fuse element R0, but also through unintended fuse elements R4, R5, R1. However, in the device illustrated in FIG. 2 that includes diodes D0, D1, D4, D5, the diode D5 is reverse biased when the selection device SD0 is turned on and the programming device PD0 is turned on. Accordingly, since diode D5 in circuit branch CB5 is reverse biased, diode D5 blocks the current thereby preventing the current from flowing through the circuit branches CB4, CB5, CB1 in alternate current path Path1. As such, the current only passes through the circuit branch CB0 and the fuse element R0 as intended. In some embodiments, due to the non-ideal behavior of diode D5, some of the current may not be prevented as a small amount of leakage current may still pass through the circuit branches CB4, CB5, CB1. However, the leakage current is low enough so as not to effect the resistance state of the fuse element R0.

Compared to other approaches, where each programming device corresponds to a single fuse element, each programming device PD0-PD3 is configured to program multiple fuse elements R0-R7 thereby reducing the area of memory circuit 200. In this embodiment, each programming device PD0-PD3 is configured to program a pair of the fuse elements R0-R7. Thus, in some embodiments, fewer programming devices PD0-PD3 are used to program the fuse elements R0-R7 thereby reducing the area of memory circuit 200. In some embodiments, the diodes D0-D7 allow for the configuration of memory circuit 200 by preventing alternative current paths from flowing through fuse elements R0-R7 in unselected circuit branches CB0-CB7 in at least programming or read operations.

Additionally, the drain DS2 of the selection device SD2 is connected to another end of the circuit branch CB2 at node NC2, and is connected to another end of the circuit branch CB6 at node NC2. The selection device SD2 provides a selectable connection to the bit line BL2 in response to a bit line selection signal received at the gate GS2 of the selection device SD2. In this example, the selection device SD2 is a PMOS transistor and thus, the bit line selection signal is provided in a low logical value to turn on the selection device SD2 and thereby select the bit line BL2. An anode of the diode D2 is connected to the drain DS2 of the selection device SD2 by node NC2, and a cathode of the diode D2 is connected to the drain DP1 of the programming device PD1 by fuse element R2. In other words, the fuse element R2 is connected between the cathode of the diode D2 and the drain DP1 of the programming device PD1. Furthermore, the anode of the diode D6 is connected to the drain DS2 of the selection device SD2 by node NC2, and the cathode of the diode D6 is connected to the drain DP3 of the programming device PD3 by fuse element R6. In other words, the fuse element R6 is connected between the cathode of the diode D6 and the drain DP3 of the programming device PD3. Accordingly, the selection device SD2 is connected to circuit branches CB2, CB6 at node NC2. Furthermore, the circuit branches CB2, CB6 are connected to programming devices PD1, PD3 at nodes NP1, NP3, respectively, where the programming devices PD1, PD3 are controlled by different word lines WL0, WL1.

The drain DS3 of the selection device SD3 is connected to another end of the circuit branch CB3 at node NC3, and is connected to another end of the circuit branch CB7 at node NC3. The selection device SD3 provides a selectable connection to the bit line BL3 in response to a bit line selection signal received at the gate GS3 of the selection device SD3. In this example, the selection device SD3 is a PMOS transistor and thus, the bit line selection signal is provided in a low logical value to turn on the selection device SD3 and thereby select the bit line BL3. An anode of the diode D3 is connected to the drain DS3 of the selection device SD3 by node NC3, and a cathode of the diode D3 is connected to the drain DP1 of the programming device PD1 by fuse element R3. In other words, the fuse element R3 is connected between the cathode of the diode D3 and the drain DP1 of the programming device PD1. Furthermore, the anode of the diode D7 is connected to the drain DS3 of the selection device SD3 by node NC3, and the cathode of the diode D7 is connected to the drain DP3 of the programming device PD3 by fuse element R5. In other words, the fuse element R5 is connected between the cathode of the diode D7 and the drain DP3 of the programming device PD3. Accordingly, the selection device SD3 is connected to circuit branches CB3, CB7 at node NC3. Furthermore, the circuit branches CB3, CB7 are connected to programming devices PD1, PD3 at nodes NP1, NP3, respectively, where the programming devices PD1, PD3 are controlled by different word lines WL0, WL1.

In some embodiments, the connection of the circuit branches CB2, CB3, CB6, CB7 to the same pair of selection devices SD2, SD3 and programming devices PD1, PD3 controlled by different word lines WL0, WL1 can create multiple current paths to the programming device PD1, PD3. In some embodiments, the addition of diodes D2, D3 and diodes D6, D7 to memory circuit 200 disrupts at least one of the current paths. In particular, if one of the circuit branches CB2, CB3, CB6, CB7 connected to one of the programming devices PD1, PD3 is selected for programming, the pair of circuit branches CB6, CB7, CB2, CB3 connected to the other one of the programming devices PD3, PD1 would create an alternative current path to the other circuit branch CB3, CB2, CB7, CB6 connected to the same one of the programming devices PD1, PD3. The diodes D6, D7, D2, D3 are configured to stop current from flowing to this alternate current path.

An example will help illustrate. For instance, if fuse element R2 has been selected to be programmed, then a low logical value is applied to the gate GS2 of the selection device SD2 to select the bit line BL2 to turn on the selection device SD2, and a high logical value is applied to the word line WL0 to turn on the programming device PD1. Accordingly, a current (Path2) will be generated in the circuit branch CB2. However, if the diodes D2, D3, D6, D7 were not included in memory circuit 200, the circuit branches CB6, CB7 connected to the drain DP3 of the programming device PD3 would provide an alternate current path (Path3) to the drain DP1 of the programming device PD1, and further through the circuit branch CB3 to node NP1. In other words, without diodes D2, D3, D6, D7, the current would be provided through the intended fuse element R2 but also through unintended fuse elements R6, R5, R3. However, in the device illustrated in FIG. 2 that includes diodes D2, D3, D6, D7, the diode D7 is reverse biased when the selection device SD2 is turned on and the programming device PD1 is turned on. Accordingly, since diode D5 in circuit branch CB5 is reverse biased, the diode D7 blocks the current thereby preventing the current from flowing through the circuit branches CB6, CB7, CB3. As such, the current only passes through the circuit branch CB2 and the fuse element R2 (e.g., Path2) as intended. In some embodiments, due to the non-ideal behavior of diode D7, some of the current may not be prevented as a small amount of leakage current may still pass through the circuit branches CB6, CB7, CB3. However, the leakage current is low enough so as not to effect the resistance state of the fuse element R2. Other configurations of memory device 200 are within the scope of the present disclosure.

Figure 3:
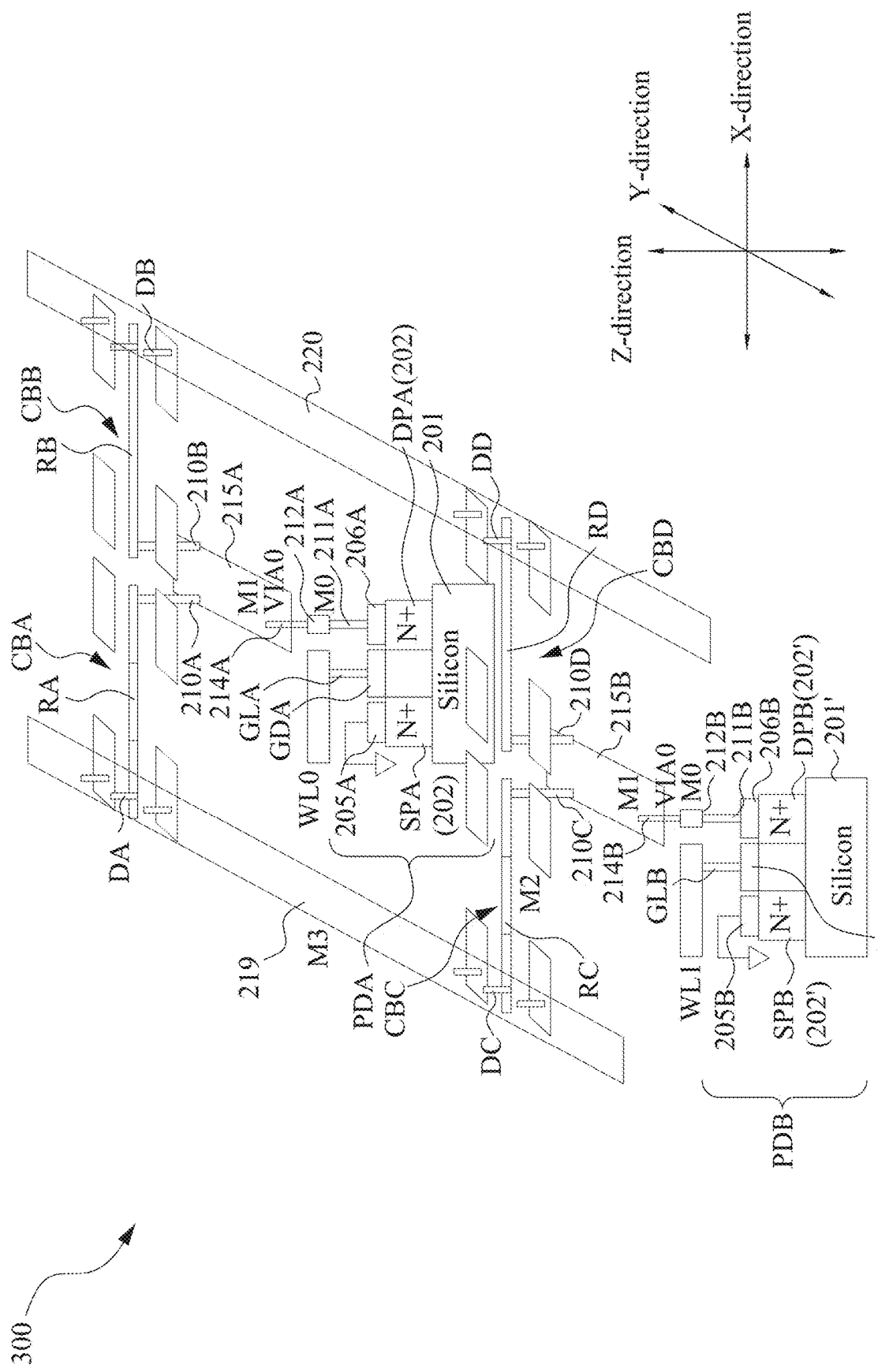
FIG. 3 is a three-dimensional (3D) perspective view of a memory circuit, in accordance with some embodiments.

FIG. 3 is a 3D perspective view of a memory circuit 300, in accordance with some embodiments. In some embodiments, memory circuit 300 includes programming devices PDA, PDB and two pairs of circuit branches CBA, CBB, CBC, CBD.

Memory circuit 300 is an embodiment of memory device 200 of FIG. 2. Programming devices PDA, PDB are embodiments of corresponding programming devices PD0, PD2 or programming devices PD1, PD3, and similar detailed description is omitted. Also, with regard to FIG. 2, the circuit branches CBA, CBB, CBC, CBD of FIG. 3 are embodiments of corresponding circuit branches CB0, CB1, CB4, CB5 or circuit branches CB2, CB3, CB6, CB7, and similar detailed description is omitted. Fuse elements RA, RB, RC, RD of FIG. 3 are embodiments of corresponding fuse elements R0, R1, R4, R5 or fuse elements R2, R3, R6, R7 in FIG. 2. Furthermore, diodes DA, DB, DC, DD of FIG. 3 are embodiments of corresponding diodes D0, D1, D4, D5 or D2, D3, D6, D7 in FIG. 2. In FIG. 3, the Y-direction, the Z-direction and the X-direction are shown, where the Y-direction, the Z-direction and the X-direction are orthogonal to one another.

As shown in FIG. 3, the programming device PDA is formed in a portion of semiconductor substrate 201. The semiconductor substrate 201 has active regions 202 that have been doped. In some embodiments, the programming device PDA is an NMOS and thus the active regions 202 are doped with n-type doping. In other embodiments, the programming device PDA is a PMOS and thus the active regions 202 are doped with p-type doping material. The active regions 202 are sometimes referred to as oxide definition (OD) regions. Examples of circuit elements that may be formed include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, P-channel and/or N-channel field effect transistors (PFETs/NFETs), etc., FinFETs, planar MOS transistors with raised source/drains, nanosheet FETs, nanowire FETs, or the like. In some embodiments, the active regions 202 of substrate 201 extend in the Y-direction, and are spaced apart from one another in the X-direction.

A drain DPA and a source DSA are located in the active region 202 for the programming device PDA. The drain DPA is the drain DP0 or DP1 of corresponding programming device PD0 or PD1. The source DSA is the source DS0 or DS1 of corresponding programming device PD0 or PD1. The source DSA is connected to a reference voltage, e.g. a ground voltage (VSS). A gate GDA of the programming device PDA is located in the POLY layer of memory circuit 300. In some embodiments, the POLY layer is above the active region or the OD layer. Contacts 206A, 205A for the drain DPA and the source SPA are located in a metal over diffusion (MD) layer of memory circuit 300. In some embodiments, the MD layer is located directly over the drain DPA and source SPA or the active layer/OD of memory circuit 300.

A gate GDA is the gate GP0 or GP1 of corresponding programming device PD0 or PD1. A via GLA is on the gate GDA in a via over gate (VG) layer. In some embodiments, the VG layer is located directly over the POLY layer and directly beneath a metal-0 (M0) layer. The via GLA is connected to the word line WL0, where the word line WL0 is located in the metal layer M0. Furthermore, the drain DPA of the programming device PDA is connected to a via 211A, that is in a via over diffusion (VD) layer. In some embodiments, the VD layer is directly over the MD layer and directly beneath the M0 metal layer. The via 211A is connected to a conductor 212A, that is in the metal layer M0. The conductor 212A is connected to a via 214A, that is in a via over M0 (VIA0) layer of memory circuit 300. In some embodiments, VIA0 is directly over the metal layer M0 and directly beneath a metal-one (M1) layer. The via 214A is connected to a conductor 215A in metal layer M1. The conductor 215A is a node (e.g., node NP0 or NP1) that connects one end of the circuit branches CBA, CBB together. The conductor 215A is in the metal-1 (M1) layer. Conductor 215A is connected to a via 210A and a via 210B. Via 210A is one end of the circuit branch CBA, and via 210B that is one end of the circuit branch CBB. In some embodiments, via 210A and 210B are in the via over M1 (VIA1) layer of memory circuit 300.

With regard to the circuit branch CBA, the circuit branch CBA has one end coupled to via 210A. In some embodiments, layer VIA1 is between the metal layer M1 and a metal-two (M2) layer. The circuit branch CBA is further connected to one end of a fuse element RA. The fuse element RA is in the metal-2 (M2) layer. In some embodiments, metal layer M2 is directly above layer VIA1 and directly below layer VIA2. The opposite end of the fuse element RA is connected to a diode DA. In some embodiments, diode DA is a via between the M2 metal layer and the metal-3 (M3) layer. In some embodiments, the diode DA is in the via over M2 (VIA2) layer of memory circuit 300. In some embodiments, the VIA2 layer is between the metal layer M2 and metal layer M3. In some embodiments, the metal layer M3 is directly above layer VIA2. One end of the diode DA is coupled to the circuit branch CBA. In other words, diode DA also corresponds to the other end of the circuit branch CBA. In some embodiments, at least diode DA, DB, DC or DD is a tantalum oxide (TaOx) diode. In some embodiments, at least diode DA, DB, DC or DD is a tantalum oxide ($Ta_2O_5$) diode.

The other end of diode DA is connected to a conductor 219 that is in the metal layer M3. In some embodiments, the conductor 219 is bit line BL0 or BL1 of FIG. 2. In some embodiments, conductor 219 is coupled to the drain of a selection device (not shown).

With regard to the circuit branch CBB, the circuit branch CBB has one end coupled to via 210B. In some embodiments, via 210B is in the VIA1 layer. The circuit branch CBB is further connected to one end of a fuse element RB. In some embodiments, fuse element RB is in the metal layer M2. The opposite end of the fuse element RB is connected to a diode DB. In some embodiments, diode DB is a via in the VIA2 layer. One end of diode DB is coupled to the circuit branch CBA. In other words, diode DB also corresponds to the other end of the circuit branch CBB. The other end of diode DB is connected to a conductor 220, that is in the metal layer M3. In some embodiments, the conductor 220 is bit line BL0 or BL1 of FIG. 2. In some embodiments, conductor 220 is coupled to the drain of another selection device (not shown).

As shown in FIG. 3, the programming device PDB is formed in a portion of semiconductor substrate 201'. The semiconductor substrate 201' has active regions 202' that have been doped. In some embodiments, the programming device PDA is an NMOS and thus the active regions 202' are doped with n-type doping. In other embodiments, the programming device PDB is a PMOS and thus the active regions 202' are doped with p-type doping material.

A drain DPB and a source DSB are located in the active region 202' for the programming device PDB. The drain DPB is the drain DP2 or DP3 of corresponding programming device PD2 or PD3. The source DSB is the source DS2 or DS3 of corresponding programming device PD2 or PD3. The source DSB is connected to a reference voltage, e.g. a ground voltage (VSS). A gate GDA of the programming device PDB is located in the POLY layer of memory circuit 300. Contacts 206B, 205B for the drain DPB and the source SPA are located in the MD layer of memory circuit 300.

A gate GDB is the gate GP2 or GP3 of corresponding programming device PD2 or PD3. A via GLB is on the gate GDB, and is in the VG layer. The via GLB is connected to the word line WL1, where the word line WL1 is located in the metal layer M0. Furthermore, the drain DPB of the programming device PDB is connected to a via 211B that is in the VD layer. The via 211B is connected to a conductor 212B, that is in the metal layer M0. The conductor 212B is connected to a via 214B, that is in the VIA0 layer of memory circuit 300. The via 214B is connected to a conductor 215B that is in metal layer M1. The conductor 215B is a node (e.g., node NP2 or NP3) that connects one end of the circuit branches CBC, CBD together. The conductor 215B is in the M1 layer. Conductor 215B is connected to a via 210C and via 210D. Via 210C is one end of the circuit branch CBC, and via 210D is one end of the circuit branch CBD. In some embodiments, via 210C and 210D are in the VIA1 layer of memory circuit 300. In some embodiments, via 210C and 210D are in the VIA1 layer of memory circuit 300.

With regard to the circuit branch CBC, the circuit branch CBC has one end coupled to via 210C. The circuit branch CBC is further connected to one end of a fuse element RC. In some embodiments, fuse element RC is in the metal layer M2. The opposite end of the fuse element RC is connected to a diode DC. In some embodiments, diode DC is a via in the VIA2 layer. One end of diode DC is coupled to the circuit branch CBA. In other words, diode DC also corresponds to the other end of the circuit branch CBC. The other end of diode DC is connected to the conductor 219. Conductor 219 couples the diodes DA and DC together and corresponds to node NC0 or NC2 in FIG. 2.

With regard to the circuit branch CBD, the circuit branch CBD has one end coupled to via 210D. The circuit branch CBD is further connected to one end of a fuse element RD. In some embodiments, fuse element RD is in the metal layer M2. The opposite end of the fuse element RD is connected to a diode DD. In some embodiments, diode DD is a via in the VIA2 layer. One end of diode DD is coupled to the circuit branch CBD. In other words, diode DD also corresponds to the other end of the circuit branch CBD. The other end of diode DD is connected to the conductor 220. Conductor 220 couples the diodes DB and DD together and corresponds to node NC1 or NC3 in FIG. 2.

In some embodiments, at least one gate of gates GDA, GDB includes one or more layers of a conductive material. In some embodiments, at least one gate of gates includes one or more layers of doped silicon.

In some embodiments, one or more vias of vias GLA, GLB, 210A-210D, 211A, 211B, 214A, 214B includes a metal, a metal compound or a doped semiconductor. In some embodiments, a metal includes at least Cu (Copper), Co, W, Ru, Al, or the like. In some embodiments, a doped semiconductor includes at least doped silicon, or the like.

At least contact 205A, 205B, 206A or 206B, at least conductor 215A, 215B, 219 or 220, or at least word line WL0 or WL1 include conductive materials such as metals including Cu (Copper), Co, W, Ru, Al, or the like.

In some embodiments, at least source region SPA, SPB and/or drain region DPA, DPB, comprises n-type dopants. In some embodiments, the n-type dopants include phosphorus, arsenic or other suitable n-type dopants. In other embodiments, at least source region SPA, SPB and/or drain region DPA, DPB, comprises n-type dopants. In some embodiments, the p-type dopants include boron, aluminum or other suitable p-type dopants. Other configurations of memory circuit 300 are within the scope of the present disclosure.

Figure 4:
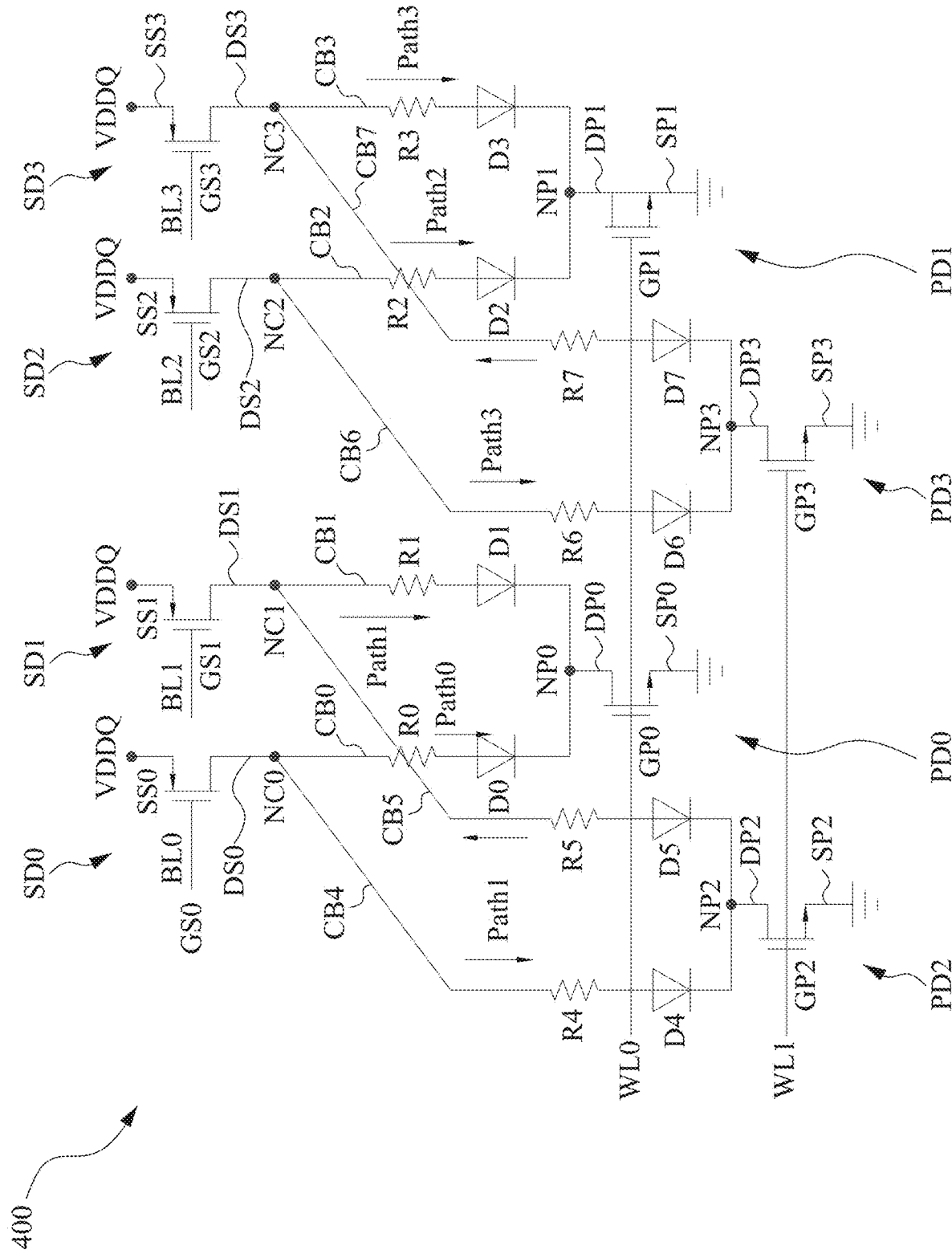
FIG. 4 illustrates a circuit diagram of a memory device, in accordance with some embodiments.

FIG. 4 illustrates a circuit diagram of a memory device 400, in accordance with some embodiments. In some embodiments, memory device 400 corresponds to a portion of the memory device 100. For example, in some embodiments, memory device 400 corresponds to 2 word lines (e.g., WL0, WL1), 4 bit lines (BL0, BL1, BL2 and BL3) and corresponding memory cells MC of memory cell array 104.

Memory device 400 is a variation of memory device 200 of FIG. 2, and similar detailed description is omitted. In comparison with memory device 200 of FIG. 2, each position of corresponding diode D0, . . . , D7 in FIGS. 2 & 4 and corresponding fuse element R0, . . . , R7 in FIGS. 2 & 4 are changed with each other, and similar detailed description is omitted. In other words, diode D0, D1 of FIG. 4 are positioned between corresponding fuse element R0, R1 and node NP0. Similarly, diode D2, D3 of FIG. 4 are positioned between corresponding fuse element R2, R3 and node NP1, diode D4, D5 of FIG. 4 are positioned between corresponding fuse element R4, R5 and node NP2, and diode D6, D7 of FIG. 4 are positioned between corresponding fuse element R6, R7 and node NP3. Thus, in FIG. 4, each anode of corresponding diode D0, . . . , D7 is coupled to corresponding fuse element R0-R7.

In some embodiments, by changing the positions of the plurality of diodes D0, . . . , D7, each of the plurality of diodes D0-D7 are vias located between the M1 layer and the M2 layer of memory device 400. Other metal layers for the plurality of diodes D0-D7 in memory circuit 400 are within the scope of the present disclosure.

As discussed above, by including the plurality of programming devices PD0-PD7 and the plurality of diodes D0-D7 in memory device 400 of FIG. 4, the diodes D0-D7 are configured to prevent alternative current paths from flowing through fuse elements R0-R7 in unselected circuit branches CB0-CB7 in at least programming or read operations, and achieving the benefits discussed above with respect to memory device 200.

Figure 5:
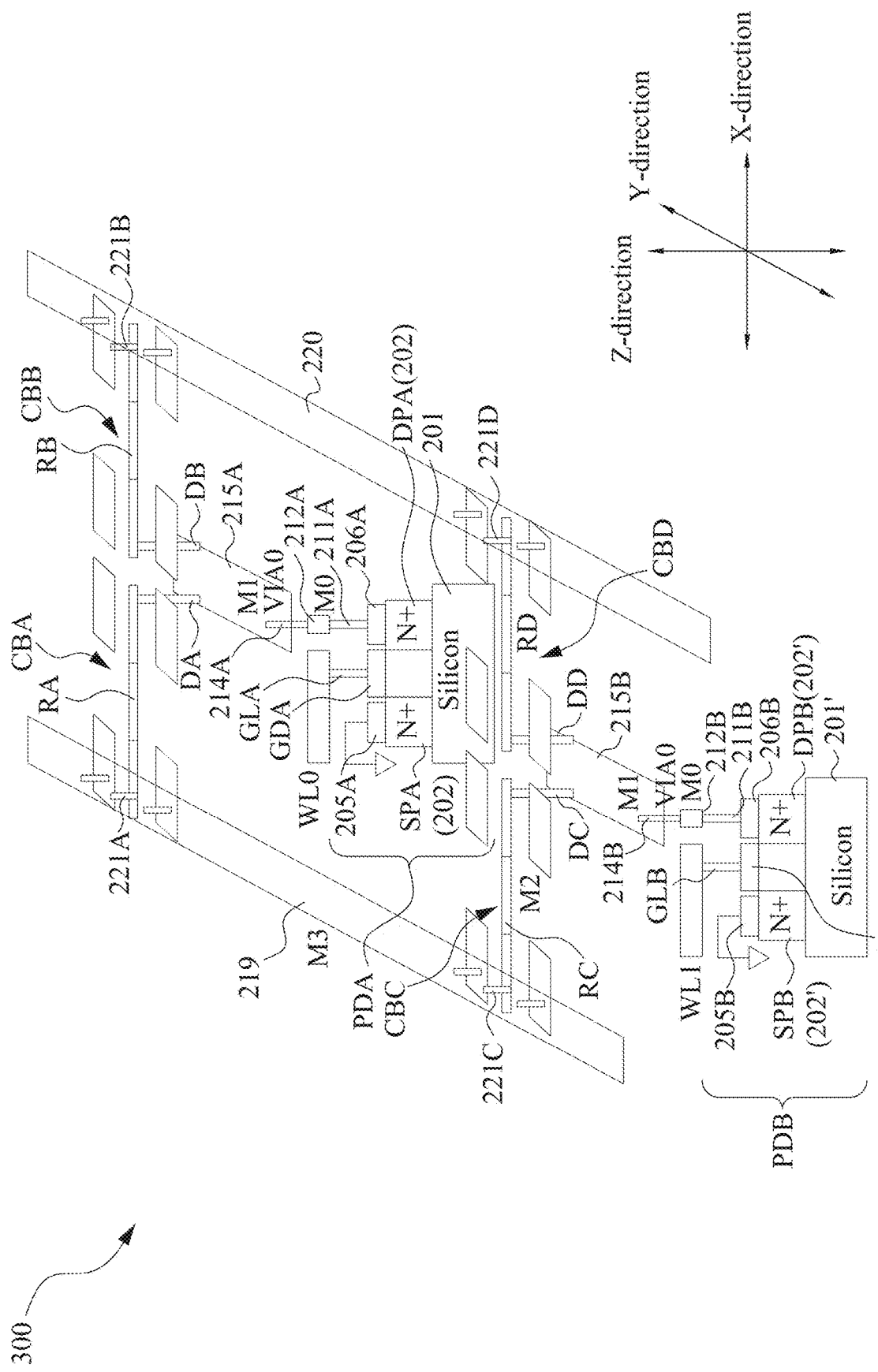
FIG. 5 is a 3D perspective view of a memory circuit, in accordance with some embodiments.

FIG. 5 is a 3D perspective view of a memory circuit 500, in accordance with some embodiments. In some embodiments, memory circuit 500 includes programming devices PDA, PDB and two pairs of circuit branches CBA, CBB, CBC, CBD. Memory circuit 500 is an embodiment of memory device 400 of FIG. 4.

Memory circuit 500 is a variation of memory circuit 300 of FIG. 3, and similar detailed description is omitted. In comparison with memory circuit 300 of FIG. 3, each of diodes DA, . . . , DD, is a via located on the VIA1 layer of memory circuit 500 or between the M1 layer and the M2 layer of memory circuit 500, but at the location of corresponding via 210A, 210B, 210C, 210D in FIG. 3, and similar detailed description is omitted.

In comparison with memory circuit 300 of FIG. 3, vias 221A, 221B, 221C, 221D in FIG. 5 replace corresponding vias 210A, 210B, 210C, 210D in FIG. 3, but at the position of corresponding diodes DA, DB, DC, DD in FIG. 3, and similar detailed description is omitted.

In some embodiments, by changing the positions of the plurality of diodes DA, . . . , DD, each of the plurality of diodes DA-DD are vias located between the M1 layer and the M2 layer of memory circuit 500. Other metal layers for the plurality of diodes DA-DD in memory circuit 500 are within the scope of the present disclosure.

In FIG. 5, conductor 215A is connected to a first end of diode DA and a first end of diode DB. A second end of diode DA in FIG. 5 is connected to a first end of circuit branch CBA, and a second end of diode DB is connected to a first end of circuit branch CBB. In some embodiments, diode DA is the first end of the circuit branch CBA in FIG. 5, and diode DB is the first end of the circuit branch CBB.

The circuit branch CBA is further connected to a first end of fuse element RA. The second end of the fuse element RA is connected to via 221A by a second end of circuit branch CBA. Via 221A is further connected to conductor 219. In some embodiments, via 221A is between conductor 219 and the second end of circuit branch CBA. In some embodiments, at least via 221A, 221B, 221C or 221D is on the VIA2 layer of memory circuit 500.

The circuit branch CBB is further connected to a first end of fuse element RB. The second end of the fuse element RB is connected to via 221B by a second end of circuit branch CBB. Via 221B is further connected to conductor 220. In some embodiments, via 221B is between conductor 220 and the second end of circuit branch CBB.

In FIG. 5, conductor 215B is connected to a first end of diode DC and a first end of diode DD. A second end of diode DC in FIG. 5 is connected to a first end of circuit branch CBC, and a second end of diode DC is connected to a first end of circuit branch CBD. In some embodiments, diode DC is the first end of the circuit branch CBC in FIG. 5, and diode DD is the first end of the circuit branch CBD.

The circuit branch CBC is further connected to a first end of fuse element RC. The second end of the fuse element RC is connected to via 221C by a second end of circuit branch CBC. Via 221C is further connected to conductor 219. In some embodiments, via 221C is between conductor 219 and the second end of circuit branch CBC. Conductor 219 couples the fuse elements RA and RC together and corresponds to node NC0 or NC2 in FIG. 2.

The circuit branch CBD is further connected to a first end of fuse element RD. The second end of the fuse element RD is connected to via 221D by a second end of circuit branch CBD. Via 221D is further connected to conductor 220. In some embodiments, via 221D is between conductor 220 and the second end of circuit branch CBD. Conductor 220 couples the fuse elements RB and RD together and corresponds to node NC1 or NC3 in FIG. 2.

As discussed above, by including the plurality of programming devices PDA-PDB and the plurality of diodes DA-DD in memory circuit 500 of FIG. 5, the diodes DA-DD are configured to prevent alternative current paths from flowing through fuse elements RA-RD in unselected circuit branches CBA-CBD in at least programming or read operations, and achieving the benefits discussed above with respect to memory device 200.

Figure 6:
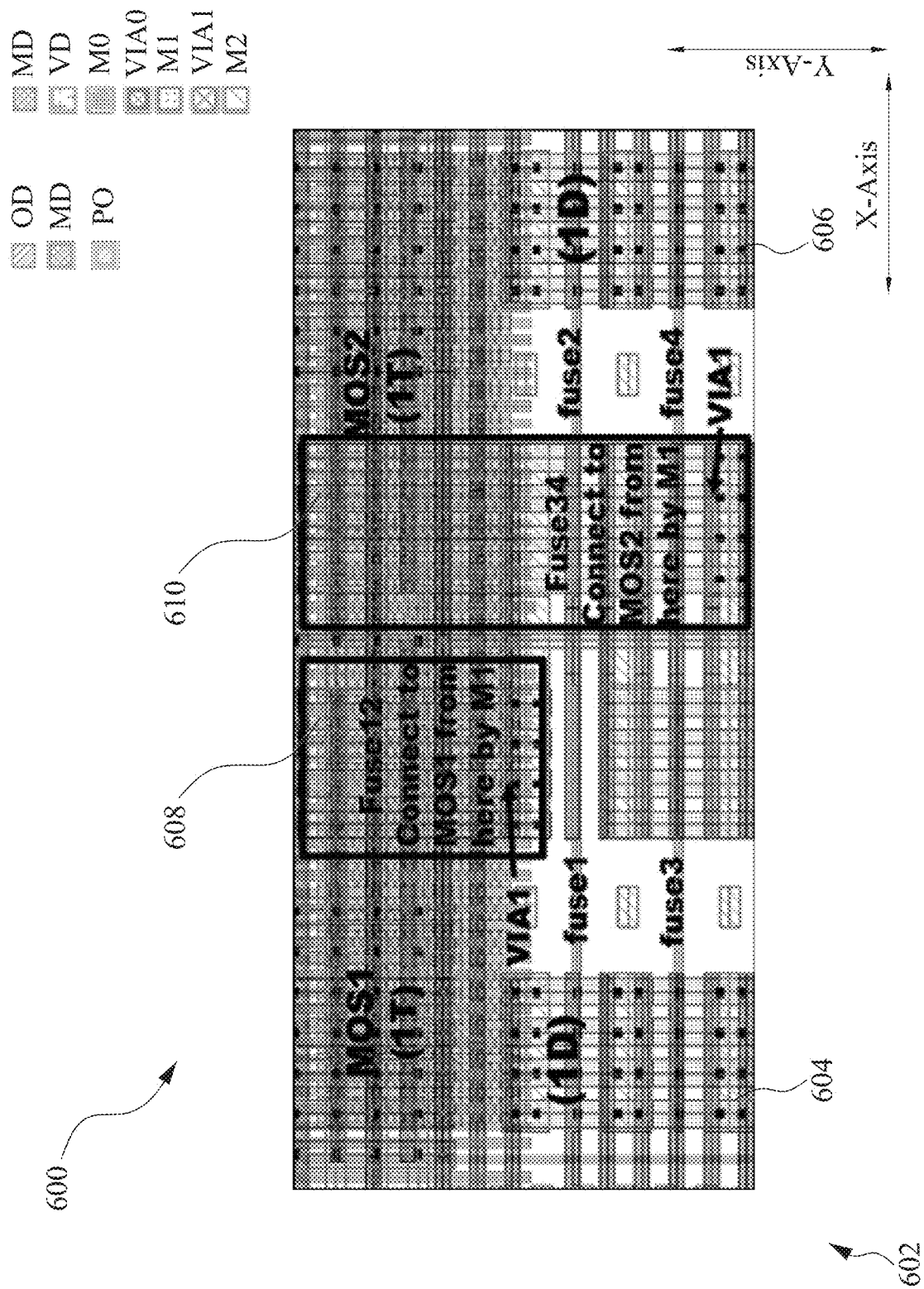
FIG. 6 is a layout diagram of a memory device, in accordance with some embodiments.

FIG. 6 is a layout diagram 600 of a memory device 602, in accordance with some embodiments. In some embodiments, layout diagram 600 corresponds to a portion of the memory device 200 of FIG. 2 or memory circuit 300 of FIG. 3. As shown in FIG. 6, an X-direction is defined along with a Y-direction that is orthogonal to the X direction.

The layout diagram 600 includes a MOS1 region (labelled as "MOS1 (1T)") that corresponds to the programming devices PD0 or PD1 in FIG. 2 or 4 or programming devices PDA in FIGS. 3 & 5 that have gates coupled to word line WL0. The layout diagram 600 also includes a MOS2 region (labelled as "MOS2 (1T)") that corresponds to programming devices PD2 or PD3 in FIG. 2 or 4 or programming device PDB in FIGS. 3 & 5 that have gates coupled to word line WL1.

Layout diagram 600 further includes a region 604 and region 606.

Region 604 corresponds to diodes D0, D1, D2, D3 of FIG. 2 or diodes DA, DB of FIG. 3. Region 606 corresponds to diodes D4, D5, D6, D7 of FIG. 2 or diodes DC, DD of FIG. 3.

Layout diagram 600 further includes a fuse1 region, a fuse2 region, a fuse3 region and a fuse4 region. In some embodiments, fuse1 region corresponds to fuse element R0 or R1 in FIG. 2, or fuse element RA in FIG. 3. In some embodiments, fuse2 region corresponds to fuse element R2 or R3 in FIG. 2, or fuse element RB in FIG. 3. In some embodiments, fuse3 region corresponds to fuse element R4 or R5 in FIG. 2, or fuse element RC in FIG. 3. In some embodiments, fuse4 region corresponds to fuse element R6 or R7 in FIG. 2, or fuse element RD in FIG. 3.

Layout diagram 600 further includes a region 608. In some embodiments, region 608 includes at least routing in the M1 layer that is useable for connecting the fuse elements in fuse1 region and fuse2 region to the programming devices in the MOS1 region. By sharing each programming device (e.g., MOS1 region) with multiple circuit branches and multiple fuse elements (e.g., fuse1 region and fuse2 region) using at least the M1 layer and the VIA1 layer in region 608, the M1 layer can intersect each of region 608, fuse1 region and fuse2 region in layout design 600, thereby reducing the area of layout design 600 resulting in the advantages described above for at least FIG. 2.

Layout diagram 600 further includes a region 610. In some embodiments, region 610 includes at least routing in the M1 layer that is useable for connecting the fuse elements in fuse3 region and fuse4 region to the programming devices in the MOS2 region. By sharing each programming device (e.g., MOS2 region) with multiple circuit branches and multiple fuse elements (e.g., fuse3 region and fuse4 region) using at least the M1 layer and the VIA1 layer in region 610, the M1 layer can intersect each of region 610, fuse3 region and fuse4 region in layout design 600, thereby reducing the area of layout design 600 resulting in the advantages described above for at least FIG. 2.

Figure 7:
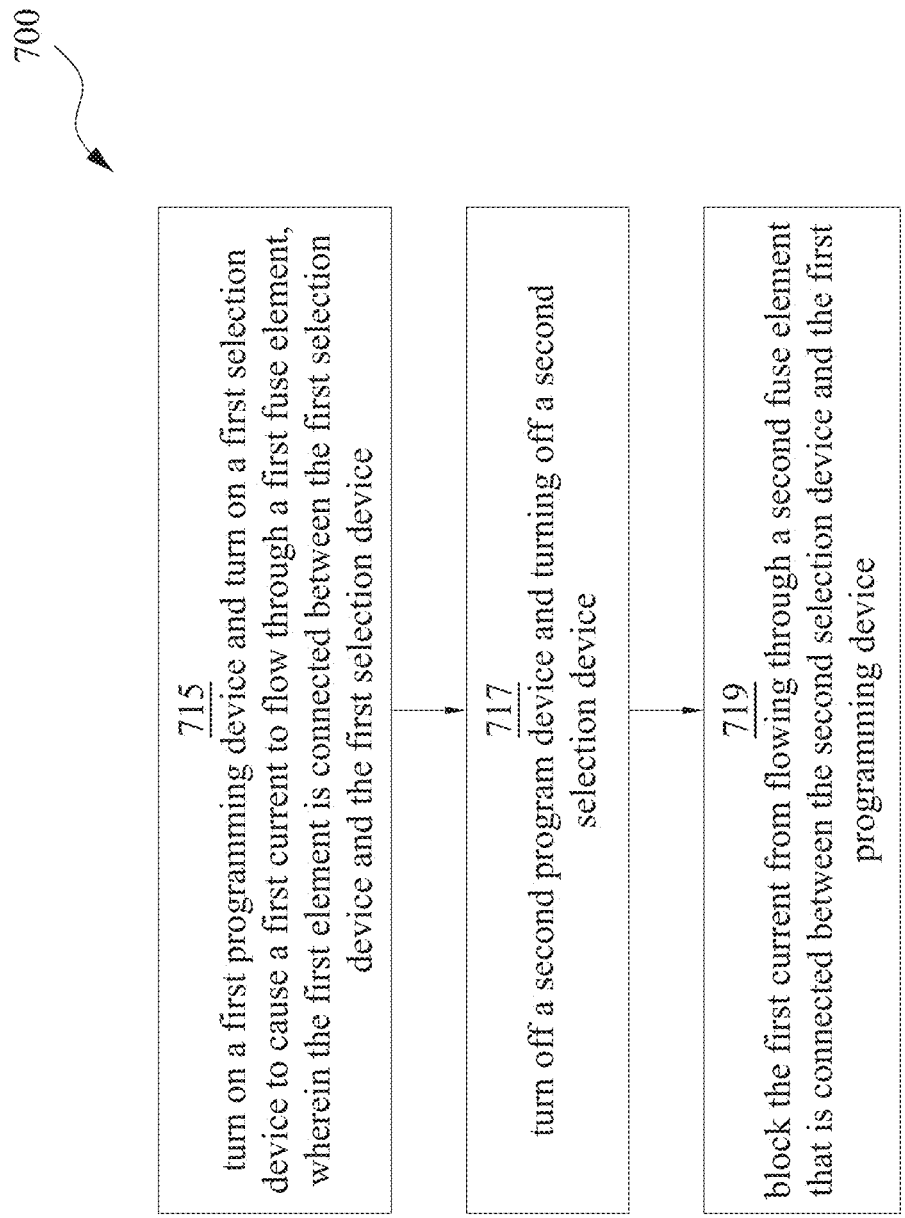
FIG. 7 is a flow chart of a method of operating a circuit, in accordance with some embodiments.

FIG. 7 is a flow chart of a method 700 of operating a circuit, in accordance with some embodiments. It is understood that additional operations may be performed before, during, and/or after the method 700 depicted in FIG. 7, and that some other processes may only be briefly described herein. In some embodiments, one or more of the operations of method 700 is not performed. It is understood that method 700 utilizes features of one or more of circuits 100-500 or layout design 600.

In at least one embodiment, the method 700 is a method of operating a memory cell having a program transistor. In some embodiments, method 700 is a method of operating memory circuit 200 or 400. In some embodiments, method 700 corresponds to a method of programming a memory cell in memory circuit 200 or 300 or memory circuit 400 or 500. In some embodiments, method 700 corresponds to a method of reading data stored in a memory cell in memory circuit 200 or 300 or memory circuit 400 or 500.

At operation 715 of method 700, a first programming device is turned on and a first selection device is turned on to cause a first current to flow through a first fuse element. In some embodiments, the first selection device and the first programming device are turned on by applying a voltage in a particular logical value. For example, if the first selection device or first programming device is an NMOS transistor, a high logical value is applied to the gate to turn on the NMOS transistor. If the first selection device or first programming device is a PMOS, a low logical value is applied to the gate to turn on the PMOS transistor. The first fuse element is connected between the first selection device and the first programming device.

In an example, the programming device PD0 of FIG. 2 or 4 is turned on, and the selection device SD0 is turned on. As such, the first current flows through the fuse element R0. In some embodiments, the first current (e.g., path0) that flows through the first fuse element R0 is sufficient to break a link in the fuse element R0, and thus is a programming current.

At operation 717 of method 700, a second selection device is turned off and a second programming device are turned off. With regard to the example described above, the programming device PD2 is turned off in response to word line signal WL1 and the selection device SD1 is turned off in response to bit line signal BL1. In some embodiments, the second selection device and the second programming device are turned off by applying a voltage of a particular logical value. For example, if the second selection device or the second programming device is an NMOS transistor, a low logical value is applied to the gate to turn off the NMOS transistor. If the second selection device or the second programming device is a PMOS transistor, a high logical value is applied to the gate to turn off the PMOS transistor. Additionally, in some embodiments, the programming devices PD1, PD3 are also turned off and the selection devices SD2, SD3 are also turned off. In other embodiments, one of the programming devices PD1, PD3 and one of the selection devices SD2, SD3 may also be turned on to perform a simultaneous programming operation.

At operation 719 of method 700, the first current is blocked from flowing through a second fuse element that is connected between the second selection device and the first programming device. In some embodiments, operation 719 includes blocking the first current by a first diode connected between the second selection device and the first programming device. Thus, continuing with the example above, diode D5 blocks the first current (path1) from flowing through the fuse element R1. In this example, the first selection device is the selection device SD0 and the second selection device is selection device SD1, the first programming device is programming device PD0 and the second programming device is programming device PD2. In some embodiments, operation 719 further includes blocking the first current from flowing through a third fuse element and a fourth fuse element. With regard to the example above, the first current is also blocked from flowing through the fuse element R4 and the fuse element R5. In some embodiments, the first diode that blocks the first current from flowing through fuse elements R4, R5, R1 is diode D5 that is coupled in series with fuse element R5. Accordingly, in some embodiments, operation 719 includes blocking the first current with the first diode such that the first current is also blocked from flowing through a third fuse element and a fourth fuse element, wherein the third fuse element is connected between the first selection device and a second programming device and the fourth fuse element is connected between the second selection device and the second programming device, wherein the diode is connected in series with the fourth fuse element.

Figure 8:
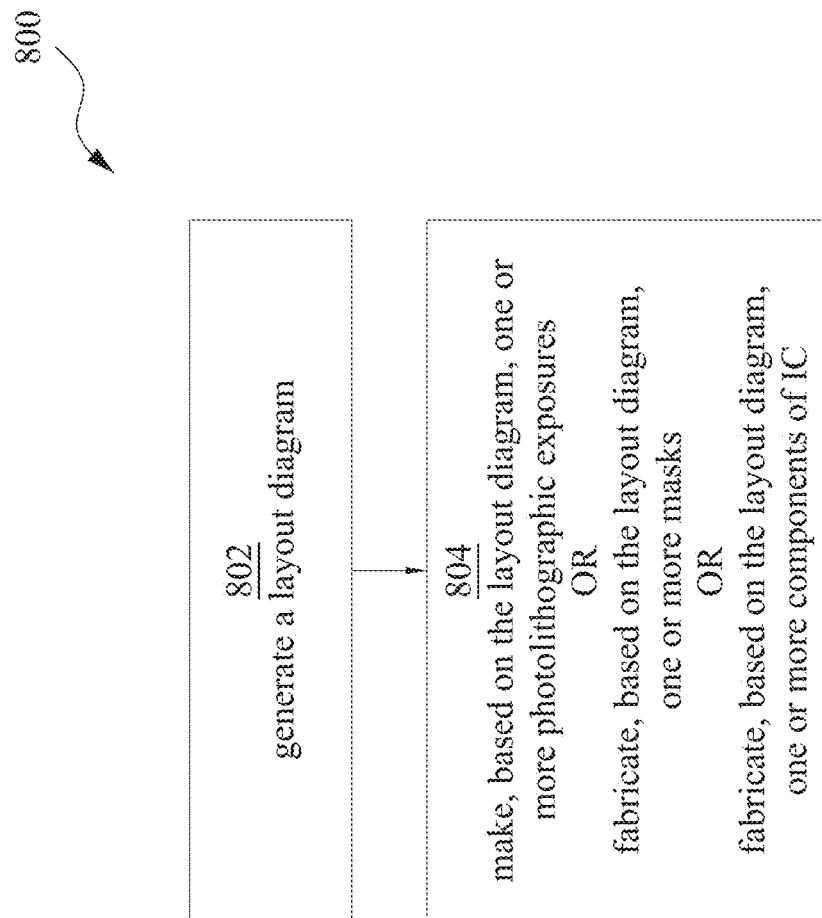
FIG. 8 is a flowchart of a method of manufacturing a memory circuit, in accordance with some embodiments.

FIG. 8 is a flowchart of a method 800 of manufacturing a memory circuit, in accordance with some embodiments.

It is understood that additional operations may be performed before, during, and/or after the method 800 depicted in FIG. 8, and that some other processes may only be briefly described herein. In some embodiments, one or more of the operations of method 800 is not performed. It is understood that method 800 utilizes features of one or more of circuits 100-500 or layout design 600.

Method 800 is implementable, for example, using EDA system 1000 (FIG. 10, discussed below) and an integrated circuit (IC), manufacturing system 1100 (FIG. 11, discussed below), in accordance with some embodiments. Regarding method 800, examples of the layout diagram include the layout diagrams disclosed herein (e.g., layout diagram 600), or the like. Examples of an IC device which can be manufactured according to method 800 include IC device 100, 200, 300, 400 or 500 in FIG. 1, FIG. 2, FIG. 3, FIG. 4 or FIG. 5.

At operation 802 of method 800, a layout diagram is generated which, among other things, include patterns representing one or more memory circuits, as disclosed herein, or the like. An example of an IC device corresponding to a layout diagram generated by operation 802 includes memory circuit 100, 200, 300, 400, 500 in FIGS. 1-5. Operation 802 is discussed in more detail below with respect to FIG. 9. In some embodiments, operation 802 is useable to generate layout diagram 600 of FIG. 6.

At operation 804 of method 800, based on the layout diagram, at least one of (A) one or more photolithographic exposures are made (B) one or more semiconductor masks are fabricated or (C) one or more components in a layer of an IC device are fabricated. See discussion below of FIG. 11.

Figure 9:
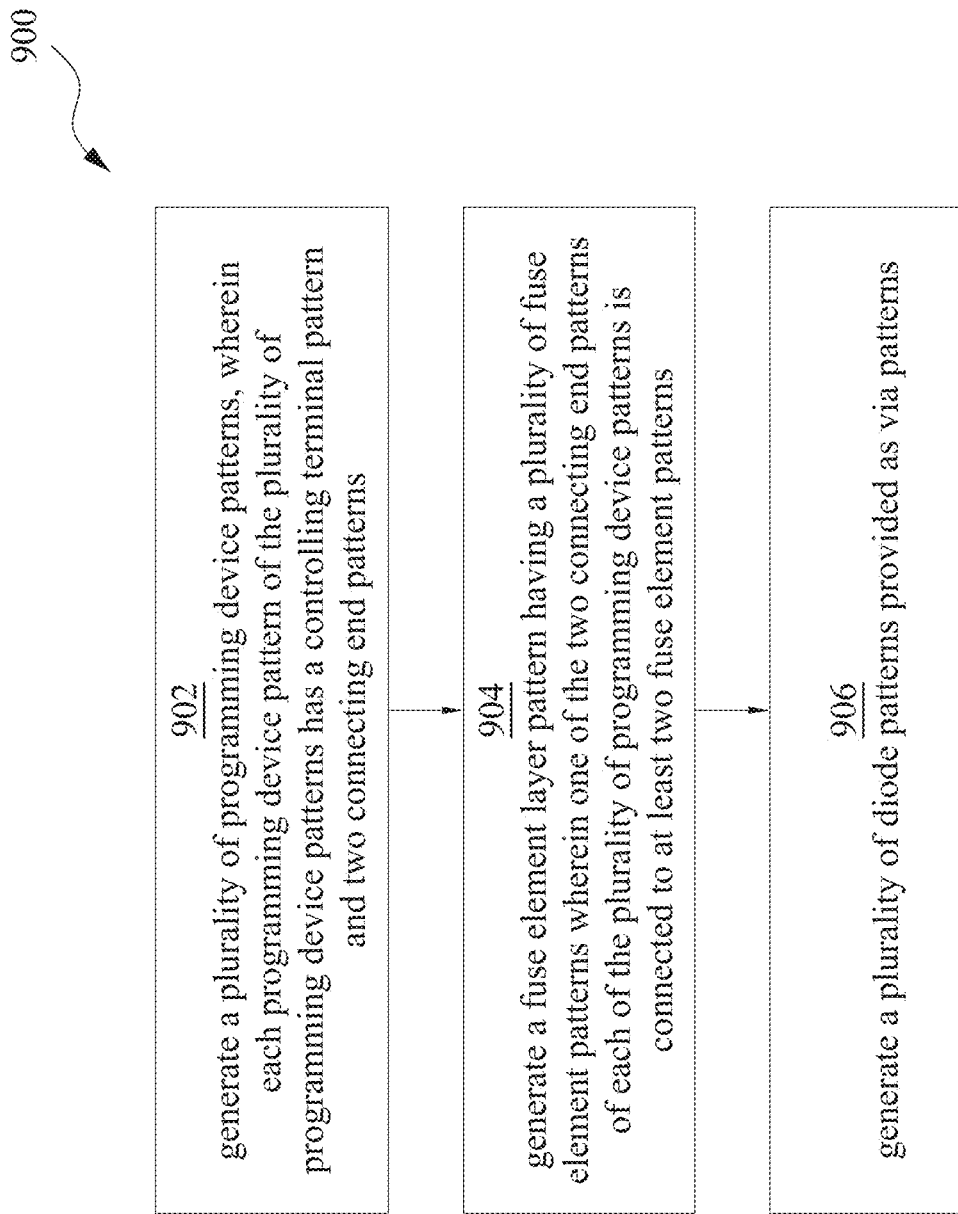
FIG. 9 is a flowchart of a method of generating a layout diagram, in accordance with some embodiments.

FIG. 9 is a flowchart of a method of generating a layout diagram, in accordance with some embodiments. It is understood that additional operations may be performed before, during, and/or after the method 900 depicted in FIG. 9, and that some other processes may only be briefly described herein. In some embodiments, one or more of the operations of method 900 is not performed. It is understood that method 900 utilizes features of one or more of circuits 100-500 or layout design 600. In some embodiments, method 900 is an embodiment of operation 802 of FIG. 8.

At operation 902 of method 900, a plurality of programming device patterns are generated, wherein each programming device pattern of the plurality of programming device patterns has a control terminal pattern and two connecting end patterns. In some embodiments, the plurality of programming device patterns include programming device patterns that correspond to the programming devices P0-P7, PA, PB in FIGS. 2-5 or MOS1 region or MOS2 region in layout diagram 600.

At operation 904 of method 900, a fuse element layer pattern having a plurality of fuse element patterns is generated wherein one of the two connecting end patterns of each of the plurality of programming device patterns is connected to at least two fuse element patterns. In some embodiments, the fuse element layer pattern includes a pattern in a layout diagram that corresponds to the fuse element layer in metal layer M2 in FIG. 3 and FIG. 5, or fuse1, fuse2, fuse3 or fuse4 in FIG. 6. In some embodiments, fuse element patterns include patterns of fuse elements R0-R7, RA-RD in FIGS. 2-5.

At operation 906 of method 900, a plurality of diode patterns are generated. In some embodiments, the plurality of diode patterns are via patterns. The plurality of diode patterns are connected to the fuse element patterns, wherein a different diode pattern of the plurality of diode patterns is connected to a different fuse element pattern of the plurality of fuse element patterns. In some embodiments, the diode patterns include patterns in a layout diagram that correspond to diodes D0-D7, DA-DD in FIGS. 2-5. In some embodiments, the diode patterns include region 704 or 706.

Figure 10:
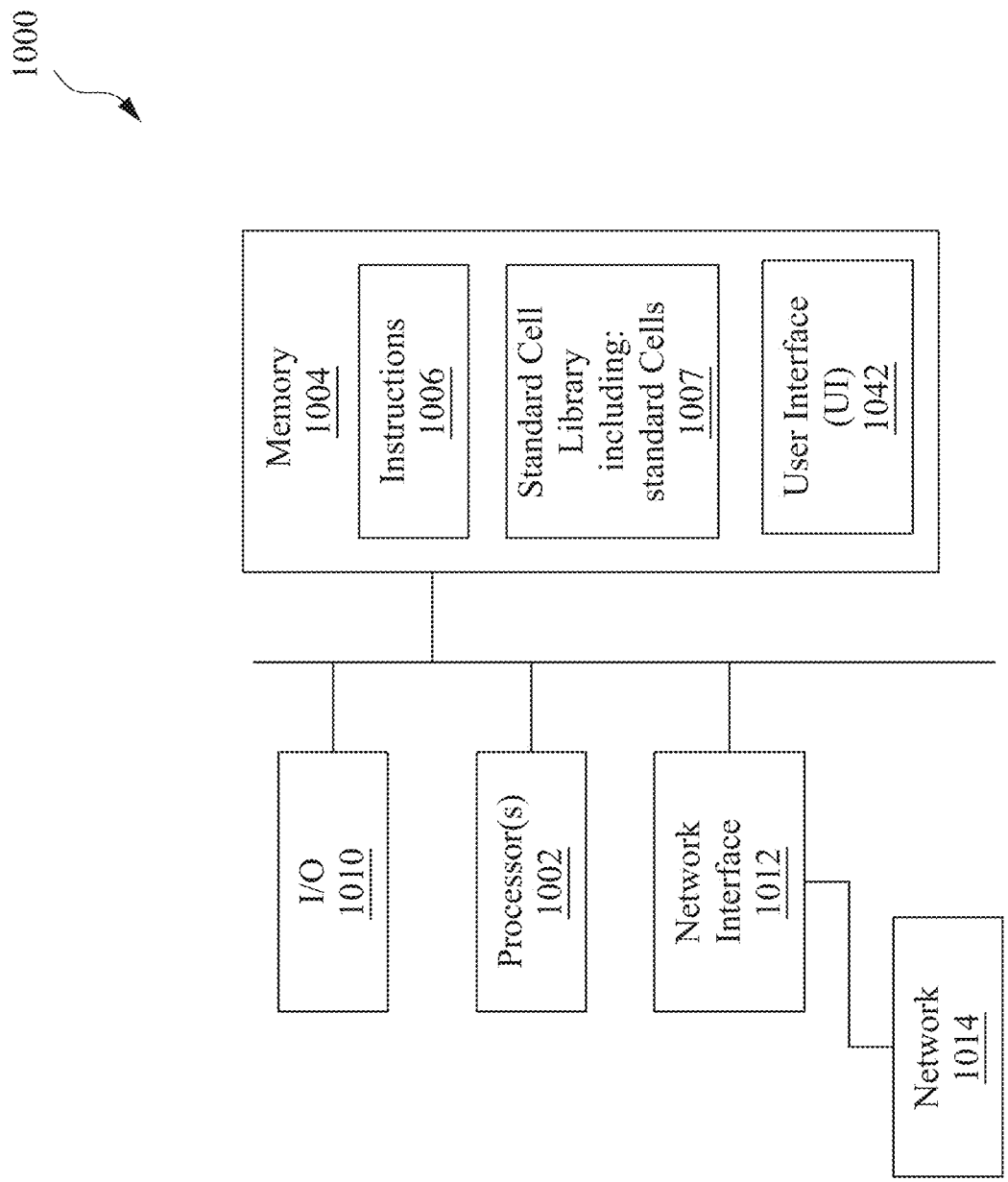
FIG. 10 is a block diagram of an electronic design automation (EDA) system in accordance with some embodiments.

FIG. 10 is a block diagram of an electronic design automation (EDA) system 1000, in accordance with some embodiments. In some embodiments, the EDA system 1000 is configured to generate a layout diagram as described above with respect to FIGS. 6, 7 and 9. In some embodiments, the EDA system 1000 is configured for designing an IC layout diagram and manufacturing an IC circuit in accordance with some embodiments.

In some embodiments, EDA system 1000 includes an APR system. Methods described herein of designing layout diagrams represent wire routing arrangements, in accordance with one or more embodiments, are implementable, for example, using EDA system 1000, in accordance with some embodiments.

In some embodiments, EDA system 1000 includes at least one hardware processor 1002 and a non-transitory, computer-readable storage medium 1004. Storage medium 1004, amongst other things, is encoded with, i.e., stores, computer program code 1006, i.e., a set of computer-executable instructions. Execution of instructions 1006 by hardware processor 1002 represents (at least in part) an EDA tool which implements a portion or all of the methods described herein in accordance with one or more embodiments (hereinafter, the noted processes and/or methods). Storage medium 1004, amongst other things, includes layout diagram(s) 1009.

Processor 1002 is electrically connected to computer-readable storage medium 1004 via a bus 1008. Processor 1002 is also electrically connected to an I/O interface 1010 by bus 1008. A network interface 1012 is also electrically connected to processor 1002 via bus 1008. Network interface 1012 is connected to a network 1014, so that processor 1002 and computer-readable storage medium 1004 are capable of connecting to external elements via network 1014. Processor 1002 is configured to execute computer program code (labelled as "instructions") 1006 encoded in computer-readable storage medium 1004 in order to cause system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, computer-readable storage medium 1004 is an electronic, magnetic, optical, electromagnetic, infrared, and/or a semiconductor system (or apparatus or device). For example, computer-readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1004 includes a compact disk-read only memory (CD-ROM), a compact disk-read/write (CD-R/W), and/or a digital video disc (DVD).

In one or more embodiments, storage medium 1004 stores computer program code 1006 configured to cause EDA system 1000 (where such execution represents (at least in part) the EDA tool) to be usable for performing a portion or all of the noted processes and/or methods. In one or more embodiments, storage medium 1004 also stores information which facilitates performing a portion or all of the noted processes and/or methods. In one or more embodiments, storage medium 1004 stores a layout diagram (e.g., layout diagram 600) or a library 1007 of standard cells including such standard cells disclosed herein.

EDA system 1000 includes I/O interface 1010. I/O interface 1010 is connected to external circuitry. In one or more embodiments, I/O interface 1010 includes a keyboard, keypad, mouse, trackball, trackpad, touchscreen, and/or cursor direction keys for communicating information and commands to processor 1002.

EDA system 1000 also includes network interface 1012 connected to processor 1002. Network interface 1012 allows EDA system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1000.

EDA system 1000 is configured to receive information through I/O interface 1010. The information received through I/O interface 1010 includes one or more of instructions, data, design rules, layout diagrams, libraries of standard cells, and/or other parameters for processing by processor 1002. The information is transferred to processor 1002 via bus 1008. EDA system 1000 is configured to receive information related to a UI through I/O interface 1010. The information is stored in computer-readable medium 1004 as user interface (UI) 1042.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1000. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 11:
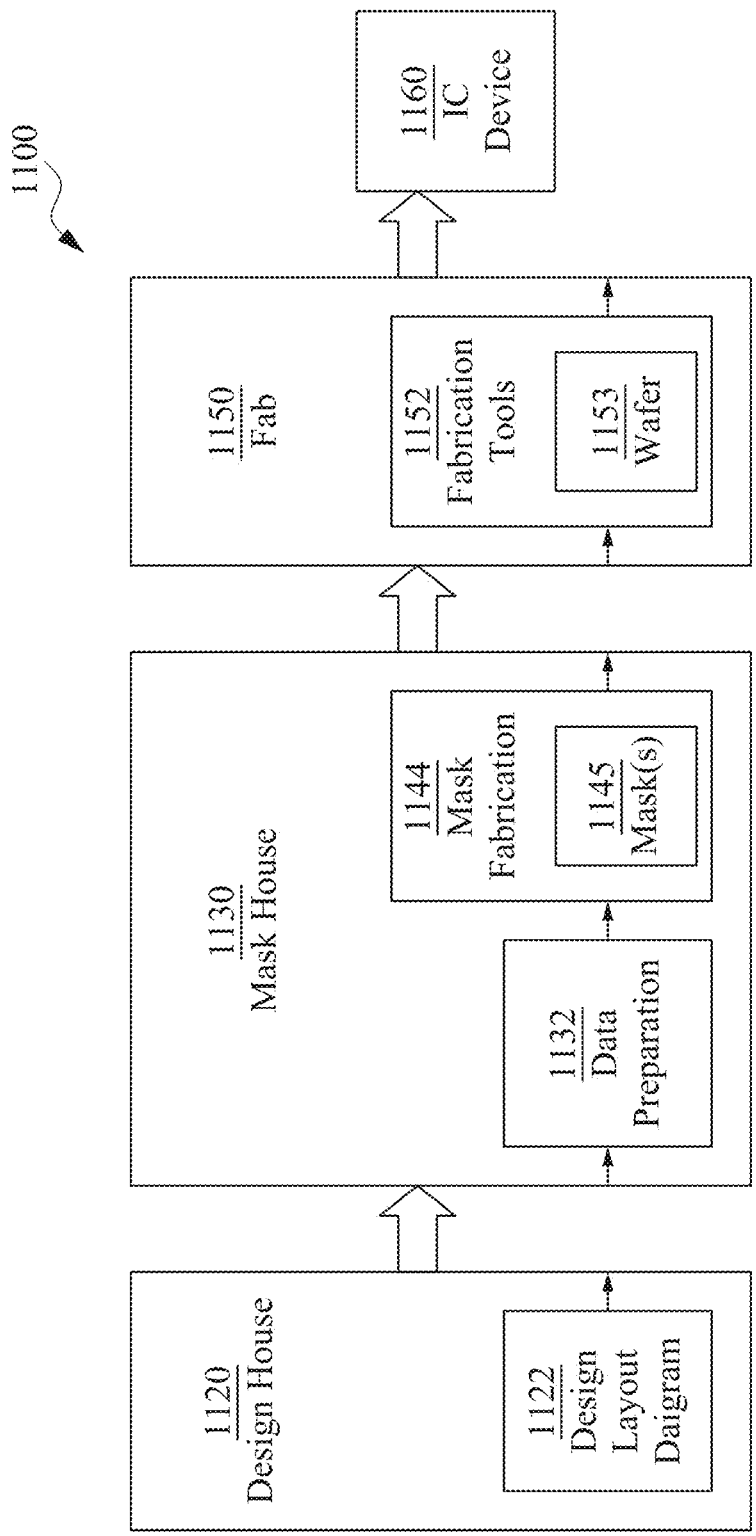
FIG. 11 is a block diagram of an integrated circuit (IC) manufacturing system, and an IC manufacturing flow associated therewith, in accordance with some embodiments.

FIG. 11 is a block diagram of an integrated circuit (IC) manufacturing system 1100, and an IC manufacturing flow associated therewith, in accordance with some embodiments. The manufacturing system 1100 is configured to manufacture at least IC device 100, 200, 300, 400 or 500 (See FIGS. 1-5) described above.

In some embodiments, based on a layout diagram, e.g., at least one of (A) one or more semiconductor masks or (b) at least one component in a layer of a semiconductor integrated circuit is fabricated using manufacturing system 1100.

In FIG. 11, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house 1120 generates an IC design layout diagram 1122. IC design layout diagram 1122 includes various geometrical patterns designed for an IC device 1160. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place and route. IC design layout diagram 1122 is presented in one or more data files having information of the geometrical patterns. For example, IC design layout diagram 1122 can be expressed in a GDSII file format or DFII file format.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is transformed into a representative data file ("RDF"). Mask data preparation 1132 provides the RDF to mask fabrication 1144. Mask fabrication 1144 includes a mask writer. A mask writer converts the RDF to an image on a substrate, such as a mask (reticle) 1145 or a semiconductor wafer 1153. The design layout diagram 1122 is manipulated by mask data preparation 1132 to comply with particular characteristics of the mask writer and/or requirements of IC fab 1150. In FIG. 11, mask data preparation 1132 and mask fabrication 1144 are illustrated as separate elements. In some embodiments, mask data preparation 1132 and mask fabrication 1144 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, mask data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

It should be understood that the above description of mask data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After mask data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1145 includes a transparent substrate (e.g., fused quartz) and an opaque material (e.g., chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 is an IC fabrication entity that includes one or more manufacturing facilities for the fabrication of a variety of different IC products. In some embodiments, IC Fab 1150 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1150 includes wafer fabrication tools 1152 (hereinafter "fabrication tools 1152") configured to execute various manufacturing operations on semiconductor wafer 1153 such that IC device 1160 is fabricated in accordance with the mask(s), e.g., mask 1145. In various embodiments, fabrication tools 1152 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multi-level interconnects, and the like (formed at subsequent manufacturing steps).

Details regarding an integrated circuit (IC) manufacturing system (e.g., system 1100 of FIG. 11), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

Figure 12:
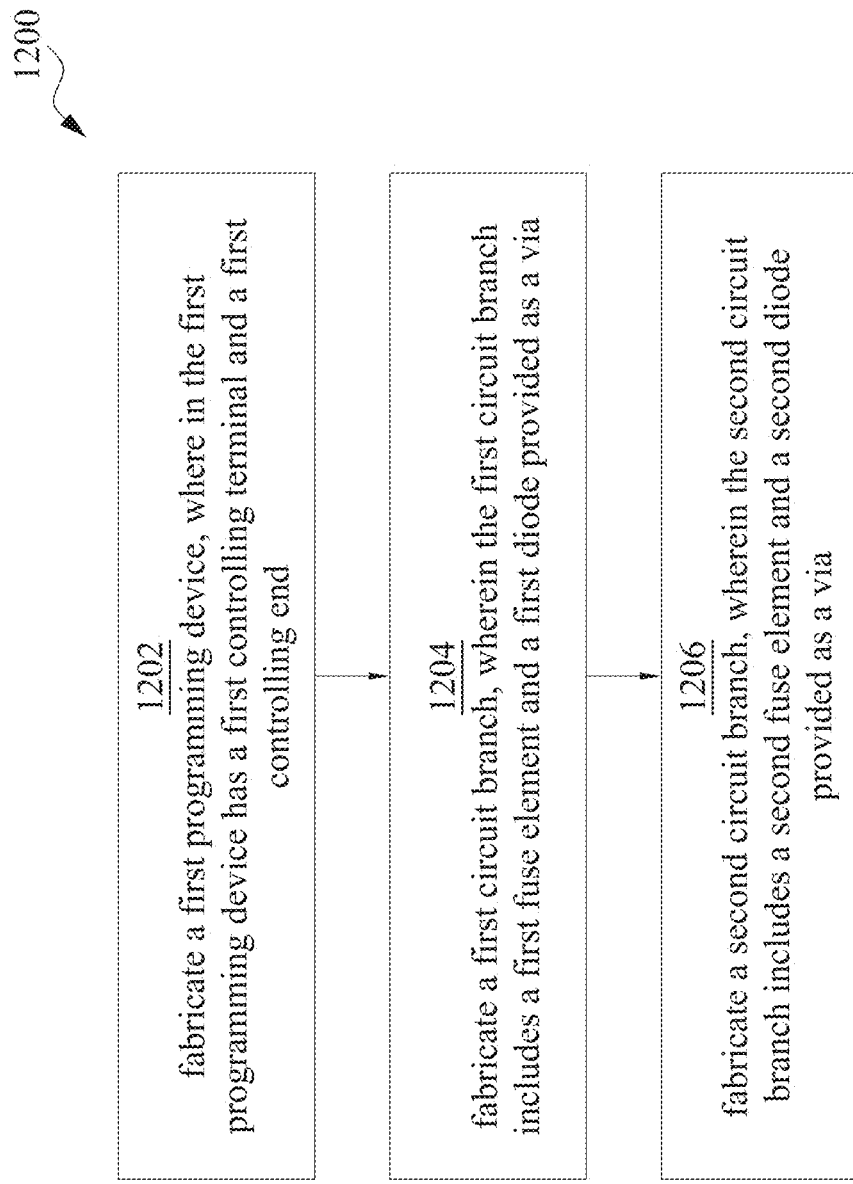
FIG. 12 is a flowchart of a method of fabricating one or more components of an IC, in accordance with some embodiments.

FIG. 12 is a flowchart of a method 1200 of fabricating one or more components of a memory circuit, in accordance with some embodiments. It is understood that additional operations may be performed before, during, and/or after the method 1200 depicted in FIG. 12, and that some other processes may only be briefly described herein. In some embodiments, one or more of the operations of method 1200 is not performed. It is understood that method 1200 utilizes features of one or more of circuits 100-500 or layout design 600.

In some embodiments, the method 1200 is usable to manufacture or fabricate at least memory circuit 100-500 of FIGS. 1-5 or an integrated circuit with similar features as at least layout diagram 600 of FIG. 6.

In some embodiments, method 1200 is an embodiment of operation 804 of FIG. 8. In some embodiments, one or more operations of method 1200 are implemented by the IC manufacturing system 1100 described above in FIG. 11.

At operation 1202 of method 1200, a first programming device is fabricated, wherein the first programming device has a first control terminal and a first connecting end. In some embodiments, operation 1202 is repeated such that a plurality of programming devices are fabricated, and each programming device including a control terminal and a connecting end. For example, in some embodiments, with respect to FIG. 3 and FIG. 5, the programming devices PD0-PD3 are fabricated. In some embodiments, the control terminal of each of the programming devices is a gate terminal (e.g., gates GP0-GP3 in FIG. 2 and FIG. 4) and the connecting end of each of the programming devices is a drain (e.g., drain DP0-DP3 in FIG. 2 and FIG. 4).

In some embodiments, for each programming device, operation 1202 further includes forming a drain region and a source region in a substrate, and forming a gate between the drain region and the source region. In some embodiments, the drain region of method 1200 includes drain DPA and DPB. In some embodiments, the source region of method 1200 includes source SPA and SPB. In some embodiments, the gate region of method 1200 includes gate GDA and GDB. In some embodiments, the gate region is between the drain region and the source region. In some embodiments, the gate region is over at least a well or the substrate.

In some embodiments, the formation of source/drain features in the substrate includes, a portion of the substrate is removed to form recesses at an edge of each spacer, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of a well is removed by an isotropic or an anisotropic etch process. The etch process selectively etches well without etching gate structure GDA or GDB and the spacers. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate. In some embodiments, the source/drain features include epitaxially grown silicon (epi Si), silicon carbide, or silicon germanium. Source/drain features of the IC device associated with the gate structure are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/or combination thereof. In some embodiments, source/drain features are further exposed to annealing processes after forming source/drain features and/or after the subsequent doping process.

In some embodiments, at least fabricating the gate regions includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

At operation 1204 of method 1200, a first circuit branch is fabricated wherein the first circuit branch includes a first fuse element and a first diode that includes a via. In some embodiments, the first circuit branch is connected to the first connecting end of the first programming device. In some embodiments, the first fuse element and the first diode are connected in series.

For example, in some embodiments, with respect to FIG. 3 and FIG. 5, the first circuit branch includes any of circuit branches CBA-CBD, the first fuse element includes any of fuse elements RA-RD, and the first diode includes any of diodes DA-DD. For example, in some embodiments, with respect to FIG. 2 and FIG. 4, the first circuit branch includes any of circuit branches CB0-CB7, the first fuse element includes any of fuse elements R0-R7, and the first diode includes any of diodes D0-D7.

In some embodiments, operation 1204 further includes at least forming one or more vias in the VG or VD layer, depositing conductors in the M0 metal layer, forming one or more vias in the VIA0 layer, depositing conductors in the M1 metal layer, forming one or more vias in the VIA1 layer, depositing conductors in the M2 metal layer, forming one or more vias in the VIA2 layer, and depositing conductors in the M3 metal layer.

In some embodiments, the vias in the VG or VD layer of method 1200 include at least via GLA, GLB, 211A or 211B. In some embodiments, the conductors in the M0 metal layer of method 1200 include at least word line WL0 or WL1 or conductor 212A or 212B. In some embodiments, the vias in the VIA0 layer of method 1200 include at least via 214A or 214B. In some embodiments, the conductors in the M1 metal layer of method 1200 include at least conductor 215A or 215B. In some embodiments, the conductors in the M2 metal layer of method 1200 include at least fuse elements RA-RD. In some embodiments, the conductors in the M3 metal layer of method 1200 include at least conductor (e.g., bit line BL) 219 or 220.

In some embodiments, forming one or more vias in the VIA2 layer includes forming one or more diodes DA, DB, DC or DD in FIG. 3. In some embodiments, the vias in the VIA2 layer of method 1200 include at least diode DA, DB, DC or DD in FIG. 3 or via 221A, 221B, 221C or 221D in FIG. 5.

In some embodiments, forming one or more vias in the VIA1 layer includes forming one or more diodes DA, DB, DC or DD in FIG. 5. In some embodiments, the vias in the VIA1 layer of method 1200 include at least via 210A, 210B, 210C or 210D in FIG. 3 or at least diode DA, DB, DC or DD in FIG. 5.

In some embodiments, one or more operations of operation 1204 or operation 1206 (described below) include using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

At operation 1206 of method 1200, a second circuit branch is fabricated wherein the second circuit branch includes a second fuse element and a second diode that includes a via. In some embodiments, the second circuit branch is connected to the first connecting end of the first programming device. In some embodiments, the second fuse element and the second diode are connected in series. In some embodiments, the first fuse element and the second fuse element are in a first metal layer that is above or below the first diode and the second diode.

For example, in some embodiments, with respect to FIG. 3 and FIG. 5, the second circuit branch includes any of circuit branches CBA-CBD, the second fuse element includes any of fuse elements RA-RD, and the second diode includes any of diodes DA-DD. For example, in some embodiments, with respect to FIG. 2 and FIG. 4, the second circuit branch includes any of circuit branches CB0-CB7, the second fuse element includes any of fuse elements R0-R7, and the second diode includes any of diodes D0-D7. In some embodiments, additional circuit branches, each having a fuse element and a diode, are connected to the first connecting end of the first programming device.

In some embodiments, at least one or more operations of method 1200 is performed by system 1100 of FIG. 11. In some embodiments, at least one method(s), such as method 1200 discussed above, is performed in whole or in part by at least one manufacturing system, including system 1100.

One or more of the operations of method 1200 is performed by IC fab 1140 (FIG. 11) to fabricate IC device 1160. In some embodiments, one or more of the operations of method 1200 is performed by fabrication tools 1152 to fabricate wafer 1142.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

Furthermore, various PMOS or NMOS transistors shown in FIGS. 1-7 are of a particular dopant type (e.g., N-type or P-type) for illustration purposes. Embodiments of the disclosure are not limited to a particular transistor type, and one or more of the PMOS or NMOS transistors shown in FIGS. 1-7 can be substituted with a corresponding transistor of a different transistor/dopant type. Similarly, the low or high logical value of various signals used in the above description is also for illustration. Embodiments of the disclosure are not limited to a particular logical value when a signal is activated and/or deactivated. Selecting different logical values is within the scope of various embodiments. Selecting different numbers of transistors in FIG. 1-7 is within the scope of various embodiments.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to a memory circuit that includes a first programming device, a first circuit branch and a second circuit branch. The first programming device includes a first control terminal coupled to a first word line, and a first connecting end. The first circuit branch includes a first diode, and a first fuse element coupled to the first diode. The second circuit branch includes a second diode, and a second fuse element coupled to the second diode. The first circuit branch and the second circuit branch are coupled to the first connecting end of the first programming device.

Another aspect of this description relates to a memory circuit. In some embodiments, the memory circuit includes a plurality of programming devices, a plurality of fuse elements in a first metal layer, a plurality of diodes coupled to the plurality of fuse elements, and a plurality of word lines extending in a first direction. In some embodiments, each programming device of the plurality of programming devices includes a first gate terminal, a second terminal and a third terminal. In some embodiments, the second terminal of each of the plurality of programming devices is coupled to at least two fuse elements of the plurality of fuse elements. In some embodiments, each diode of the plurality of diodes includes a corresponding via of a plurality of vias. In some embodiments, each word line of the plurality of word lines is coupled to at least two programming devices of the plurality of programming devices.

Yet another aspect of this description relates to a method of operating a memory circuit. In some embodiments, the method includes turning on a first programming device and turning on a first selection device thereby causing a first current to flow through a first fuse element, wherein the first fuse element is coupled between the first selection device and the first programming device. In some embodiments, the method further includes turning off a second programming device and turning off a second selection device, and blocking the first current from flowing through a second fuse element that is coupled between the second selection device and the first programming device. In some embodiments, blocking the first current from flowing through the second fuse element that is coupled between the second selection device and the first programming device, includes blocking the first current from flowing through a third fuse element and a fourth fuse element with a diode, wherein the third fuse element is coupled between the first selection device and the second programming device, and the fourth fuse element is coupled between the second selection device and the second programming device, wherein the diode is coupled in series with the fourth fuse element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
    a first programming device comprising a first control terminal coupled to a first word line, and a first connecting end;
    a first circuit branch comprising:
        a first diode that corresponds to a first via; and
        a first fuse element coupled to the first diode; and
    a second circuit branch comprising:
        a second diode that corresponds to a second via; and
        a second fuse element coupled to the second diode;
    a first conductor in a first metal layer, and being coupled to the first connecting end of the first programming device;
    a second conductor in a second metal layer above the first metal layer;
    a third via coupled between the first conductor and the second conductor;
    a third conductor in a third metal layer above the first metal layer and the second metal layer, the third conductor including the first fuse element;
    a fourth conductor in the third metal layer and being separated from the second conductor in a first direction, the fourth conductor including the second fuse element;
    a fifth conductor in a fourth metal layer above the first metal layer, the second metal layer and the third metal layer; and
    a sixth conductor in the fourth metal layer and being separated from the fifth conductor in the first direction, wherein the first circuit branch and the second circuit branch are coupled to the first connecting end of the first programming device.

2. The memory circuit of claim 1, wherein the first programming device comprises:
    an NMOS transistor including a source coupled to a reference voltage supply, a gate and a drain,
    wherein the first control terminal corresponds to the gate, and the first connecting end corresponds to the drain.

3. The memory circuit of claim 2, further comprising:
    a fourth via coupled between the second conductor and the third conductor; and
    a fifth via coupled between the second conductor and the fourth conductor,
    wherein the first diode that corresponds to the first via is coupled between the third conductor and the fifth conductor, and
    the second diode that corresponds to the second via is coupled between the fourth conductor and the sixth conductor.

4. The memory circuit of claim 2, further comprising:
    a fourth via coupled between the third conductor and the fifth conductor; and
    a fifth via coupled between the fourth conductor and the sixth conductor,
    wherein the first diode that corresponds to the first via is coupled between the second conductor and the third conductor, and
    the second diode that corresponds to the second via is coupled between the second conductor and the fourth conductor.

5. The memory circuit of claim 1, further comprising:
    a first selection device comprising a second connecting end, wherein the first circuit branch is coupled between the first connecting end of the first programming device and the second connecting end of the first selection device; and
    a second selection device comprising a third connecting end, wherein the second circuit branch is coupled between the first connecting end of the first programming device and the third connecting end of the second selection device.

6. The memory circuit of claim 5, further comprising:
    a second programming device comprising a second control terminal coupled to a second word line, and a fourth connecting end;
    a third circuit branch comprising:
        a third diode that corresponds to a fourth via; and
        a third fuse element coupled to the third diode; and
    wherein the third circuit branch is coupled between the second connecting end of the first selection device and the fourth connecting end of the second programming device;
    a fourth circuit branch comprising:
        a fourth diode that corresponds to a fourth via; and
        a fourth fuse element coupled to the fourth diode,
    wherein the fourth circuit branch is coupled between the third connecting end of the second selection device and the fourth connecting end of the second programming device.

7. The memory circuit of claim 6, wherein the third diode or the fourth diode comprises a TaOx diode.

8. The memory circuit of claim 1, wherein the first diode or the second diode comprises a TaOx diode.

9. A memory circuit, comprising:
    a plurality of programming devices, each programming device of the plurality of programming devices comprises a first gate terminal, a second terminal and a third terminal;
    a plurality of fuse elements in a first metal layer, wherein the second terminal of each of the plurality of programming devices is coupled to at least two fuse elements of the plurality of fuse elements;
    a plurality of diodes coupled to the plurality of fuse elements, each diode of the plurality of diodes includes a corresponding via of a plurality of vias;
    a plurality of word lines extending in a first direction, each word line of the plurality of word lines being coupled to at least two programming devices of the plurality of programming devices;
    a plurality of selection devices, wherein each selection device of the plurality of selection devices comprises a second gate terminal, a fourth terminal and a fifth terminal;

a plurality of bit lines extending in a second direction different from the first direction, the plurality of bit lines being coupled to the plurality of selection devices;

wherein the second gate terminal of each selection device of the plurality of selection devices is coupled to a corresponding bit line of the plurality of bit lines and is configured to receive a corresponding bit line signal.

10. The memory circuit of claim 9, wherein
the plurality of fuse elements and the plurality of diodes being coupled in a plurality of circuit branches, each circuit branch of the plurality of circuit branches having a diode of the plurality of diodes coupled in series with a fuse element of the plurality of fuse elements; and
for each programming device of the plurality of programming devices, at least two circuit branches of the plurality of circuit branches are coupled to the second terminal of each of the plurality of programming devices.

11. The memory circuit of claim 10,
wherein for each selection device of the plurality of selection devices, at least two circuit branches of the plurality of circuit branches are coupled to the fourth terminal of each selection device of the plurality of selection devices.

12. The memory circuit of claim 11, wherein
the first gate terminal of a first set of programming devices of the plurality of programming devices being coupled to each other by a first word line of the plurality of word lines; and
the first gate terminal of a second set of programming devices of the plurality of programming devices being coupled to each other by a second word line of the plurality of word lines.

13. The memory circuit of claim 12, wherein the plurality of circuit branches comprises:
a first circuit branch coupled between the fourth terminal of a first selection device of the plurality of selection devices and the second terminal of a first programming device of the first set of programming devices;
a second circuit branch coupled between the fourth terminal of a second selection device of the plurality of selection devices and the second terminal of the first programming device of the first set of programming devices;
a third circuit branch coupled between the fourth terminal of the first selection device of the plurality of selection devices and the second terminal of a second programming device of the second set of programming devices; and
a fourth circuit branch coupled between the fourth terminal of the second selection device of the plurality of selection devices and the second terminal of the second programming device of the second set of programming devices.

14. The memory circuit of claim 13, wherein the plurality of circuit branches further comprises:
a fifth circuit branch coupled between the fourth terminal of a third selection device of the plurality of selection devices and the second terminal of a third programming device of the first set of programming devices;
a sixth circuit branch coupled between the fourth terminal of a fourth selection device of the plurality of selection devices and the second terminal of the third programming device of the first set of programming devices;
a seventh circuit branch coupled between the fourth terminal of the third selection device of the plurality of selection devices and the second terminal of a fourth programming device of the second set of programming devices; and
an eighth circuit branch coupled between the fourth terminal of the fourth selection device of the plurality of selection devices and the second terminal of the fourth programming device of the second set of programming devices.

15. The memory circuit of claim 11, wherein
the plurality of programming devices include a plurality of NMOS transistors, for each NMOS transistor of the plurality of NMOS transistors, the second terminal is a drain terminal; and
the plurality of selection devices include a plurality of PMOS transistors, for each PMOS transistor of the plurality of PMOS transistors, the fourth terminal is a drain terminal.

16. The memory circuit of claim 10, wherein the diode of the plurality of diodes comprises a TaOx diode.

17. The memory circuit of claim 9, wherein each via of the plurality of vias is coupled between a conductive line on a second metal layer and a corresponding fuse element of the plurality of fuse elements in the first metal layer, wherein the first metal layer is below the second metal layer.

18. The memory circuit of claim 9, wherein each via of the plurality of vias is coupled between a conductive line on a second metal layer and a corresponding fuse element of the plurality of fuse elements in the first metal layer, wherein the first metal layer is above the second metal layer.

19. A memory circuit, comprising:
a first programming transistor comprising a first gate terminal coupled to a first word line and configured to receive a first word line signal, and a first drain terminal coupled to a first node;
a first circuit branch comprising:
a first diode that corresponds to a first via; and
a first fuse element coupled to the first diode;
a second circuit branch comprising:
a second diode that corresponds to a second via; and
a second fuse element coupled to the second diode, wherein a first end of the first circuit branch and the second circuit branch is the first node;
a first selection transistor comprising a second drain terminal coupled to a second node, wherein the first circuit branch is coupled between the first node and the second node; and
a second selection transistor comprising a third drain terminal coupled to a third node, wherein the second circuit branch is coupled between the first node and the third node, wherein
the first programming transistor further comprises:
a first source coupled to a reference voltage supply;
the first selection transistor further comprises:
a second source coupled to a voltage supply; and
a second gate coupled to a first bit line and configured to receive a first bit line signal; and
the second selection transistor further comprises:
a third source coupled to the voltage supply; and
a third gate coupled to a second bit line and configured to receive a second bit line signal.

20. The memory circuit of claim 19, wherein the first diode or the second diode comprises a TaOx diode.

\* \* \* \* \*